United States Patent
Torok et al.

(12) 
(10) Patent No.: US 6,573,713 B2
(45) Date of Patent: Jun. 3, 2003

(54) TRANSPINNOR-BASED SWITCH AND APPLICATIONS

(75) Inventors: E. James Torok, Shoreview, MN (US); Richard Spitzer, Berkeley, CA (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 0 days.

(21) Appl. No.: 10/107,533

(22) Filed: Mar. 25, 2002

(65) Prior Publication Data

US 2002/0180432 A1 Dec. 5, 2002

Related U.S. Application Data

(60) Provisional application No. 60/278,323, filed on Mar. 23, 2001.

(51) Int. Cl.$^7$ .................................................. H01L 43/00
(52) U.S. Cl. ...................... 324/252; 365/97; 365/158; 365/171; 257/421; 257/427; 257/426; 338/32 R
(58) Field of Search ................................. 324/249, 252, 324/260; 338/32 R; 257/295, 421–427, 52, 359; 360/110, 111, 113; 365/171, 173, 230.06, 158, 97

(56) References Cited

U.S. PATENT DOCUMENTS

| | | | |
|---|---|---|---|
| 3,972,786 A | 8/1976 | Ballard | 204/32 |
| 4,751,677 A | 6/1988 | Daughton et al. | 365/158 |
| 5,173,873 A | 12/1992 | Wu et al. | 365/173 |
| 5,561,368 A | 10/1996 | Dovek et al. | 324/252 |
| 5,565,236 A | 10/1996 | Gambino et al. | 427/130 |
| 5,585,986 A | 12/1996 | Parkin | 360/113 |
| 5,587,943 A | 12/1996 | Torok et al. | 365/158 |
| 5,640,754 A | 6/1997 | Lazzari et al. | 29/603.14 |
| 5,650,889 A | 7/1997 | Yamamoto et al. | 360/97.01 |
| 5,650,958 A | 7/1997 | Gallagher et al. | 365/173 |
| 5,652,445 A | 7/1997 | Johnson | 257/295 |
| 5,654,566 A | 8/1997 | Johnson | 257/295 |
| 5,686,837 A | 11/1997 | Coehoorn et al. | 324/252 |
| 5,929,636 A | 7/1999 | Torok et al. | 324/252 |
| 6,031,273 A | 2/2000 | Torok et al. | 257/421 |
| 6,169,292 B1 | 1/2001 | Yamazaki et al. | 257/157 |

OTHER PUBLICATIONS

Ranmuthu et al., *New Low Current Memory Modes with Giant Magneto–Resistance Materials.*, Apr. 13, 1993, Digests of International Magnetics Conference.

J.L. Brown, Member IEEE, A.V. Pohm Fellow IEEE., *1–Mb Memory Chip Using Giant Magnertoresistive Memory Cells.*, 4612A IEEE Transactions on Components, Packing, and Manufacturing Technology—Part A 17(1994) Sep., No. 3, New York, U.S., pp. 373–379, © 1994 IEEE.

(List continued on next page.)

Primary Examiner—Jay Patidar
(74) Attorney, Agent, or Firm—Beyer Weaver & Thomas, LLP

(57) ABSTRACT

A transpinnor switch is described having a network of thin-film elements in a bridge configuration, selected ones of the thin-film elements exhibiting giant magnetoresistance. The switch also includes at least one input conductor inductively coupled to a first subset of the selected thin-film elements, and a switch conductor inductively coupled to a second subset of the selected thin-film elements for applying magnetic fields thereto. The switch is configurable using the switch conductor to generate an output signal representative of an input signal on the input conductor. The switch is also configurable using the switch conductor to generate substantially no output signal regardless of whether the input signal is present. The transpinnor switch described herein may be used in a wide variety of applications including, for example, a field programmable gate array.

77 Claims, 17 Drawing Sheets

OTHER PUBLICATIONS

J.M. Daughton, *Magnetoresistive Memory Technology.*, 2194 *Thin Solid Films*, 216 (1992) Aug. 28, No., Lausanne, CH., pp. 162–168.

Spong et al., *Giant Magnetoresistive Spin Valve Bridge Sensor., IEEE Transactions on Magnetic* vol. 32, No. 2, Mar. 1996. pp. 366–371.

Mark Johnson, *Bipolar Spin Switch*, Apr. 16, 1993, Bellcore, Red Bank, NJ, vol. 260., pp. 320–323.

Paul A. Packan., *Pushing the Limits*, Perspective Device Physics., Sep. 24, 1999, vol. 285, pp. 2079–2081.

*The All–Metal Spin Transistor.*, Advanced Technology/Solid State, IEEE Spectrum May 1994., pp. 47–51. © 1994 IEEE.

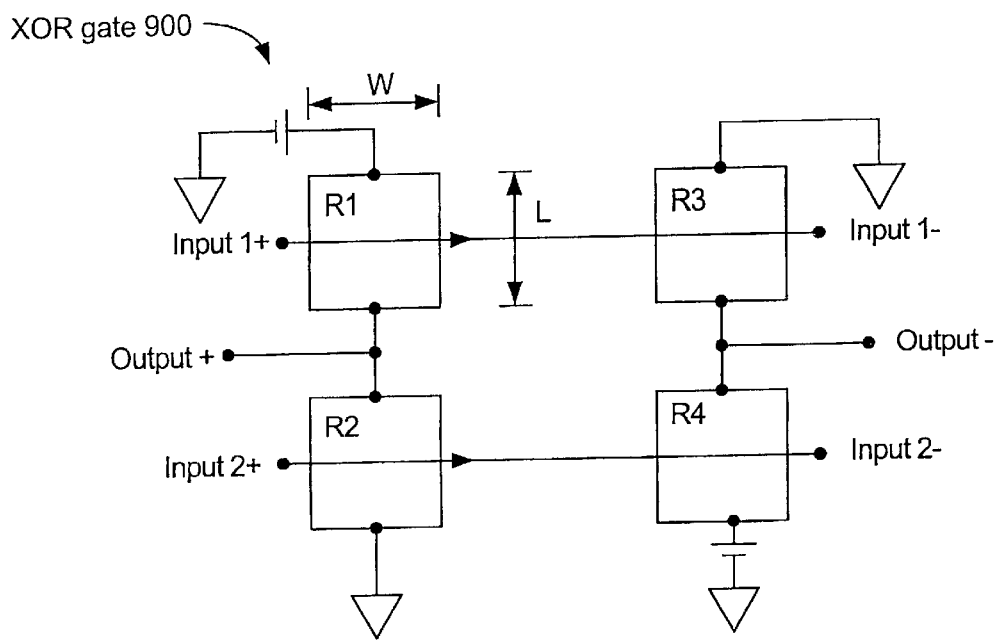
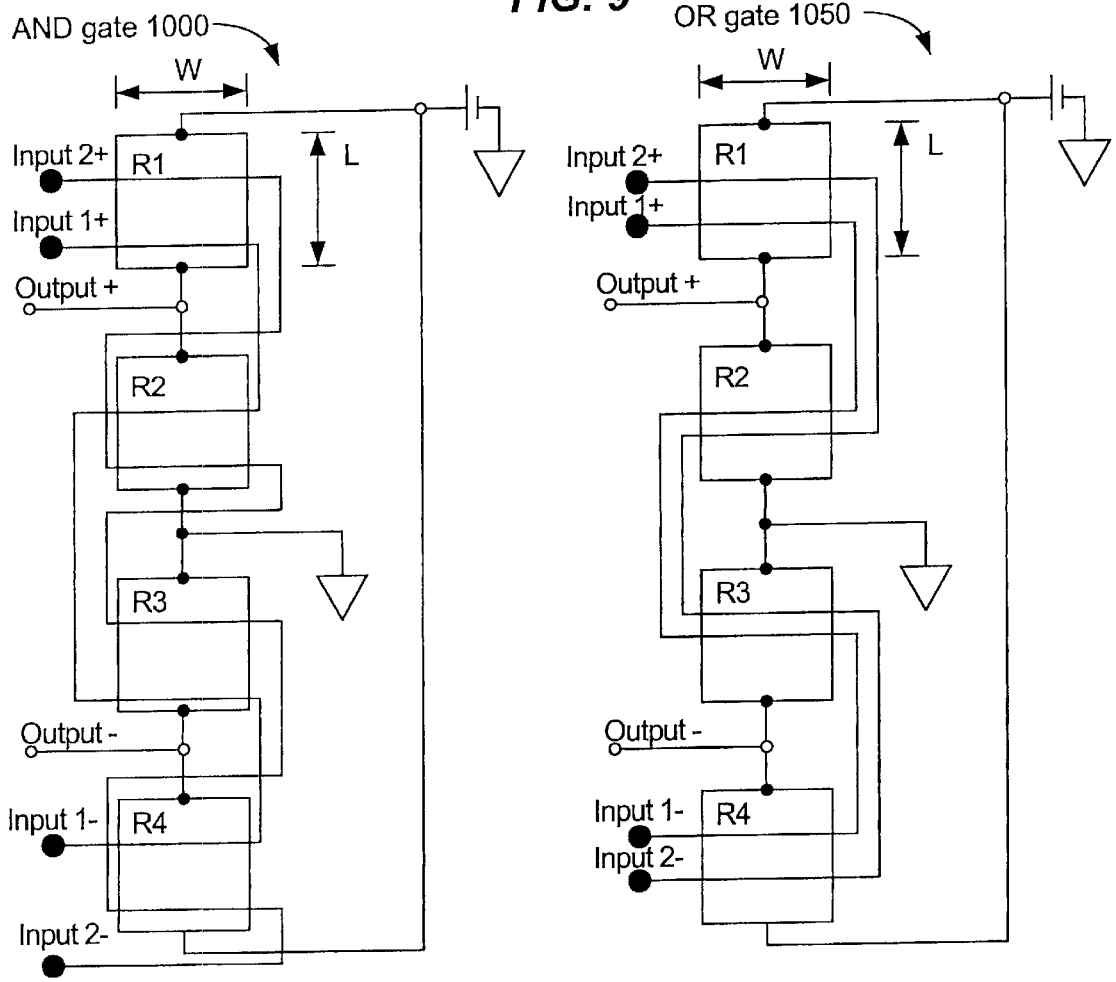
*FIG. 10A*   *FIG. 10B*

TRANSPINNOR-BASED SWITCH AND APPLICATIONS

RELATED APPLICATION DATA

The present application claims priority from U.S. Provisional Patent Application No. 60/278,323 for ELECTRONIC AND MICROELECTROMECHANICAL DEVICES AND SYSTEMS EMPLOYING GIANT MAGNETORESISTIVE FILMS filed on Mar. 23, 2001, the entire disclosure of which is incorporated herein by reference for all purposes.

BACKGROUND OF THE INVENTION

The present invention relates to circuits and systems incorporating solid-state devices referred to herein as "transpinnors" and described in U.S. Pat. Nos. 5,929,636 and 6,031,273, the entire disclosures of which are incorporated herein by reference for all purposes. More specifically, the present application describes a transpinnor-based switch and various applications thereof.

The vast majority of electronic circuits and systems manufactured and sold today are based on semiconductor technology developed over the last half century. Semiconductor processing techniques and techniques for manufacturing integrated circuits have become increasingly sophisticated resulting in ever smaller device size while increasing yield and reliability. However, the precision of such techniques appears to be approaching its limit, making it unlikely that systems manufactured according to such technique will be able to continue their historical adherence to Moore's Law which postulates a monotonic increase in available data processing power over time.

In addition, as the techniques for manufacturing semiconductor integrated circuits have increased in sophistication, so have they correspondingly increased in cost. For example, current state-of-the-art integrated circuits require a large number of processing steps to integrate semiconductor circuitry, metal layers, and embedded circuits, an issue which is exacerbated by the varied nature of the materials being integrated. And the demand for higher levels of complexity and integration continue to grow. The technical difficulties facing the semiconductor industry are well summarized by P. Packan in the Sep. 24, 1999, issue of *Science* magazine beginning at page 33, incorporated herein by reference in its entirety for all purposes.

Finally, there are some applications for which conventional semiconductor integrated circuit technology is simply not well suited. An example of such an application is spacecraft systems in which resistance to external radiation is extremely important. Electronic systems aboard spacecraft typically require elaborate shielding and safeguards to prevent loss of information and/or system failure due to exposure to any of the wide variety of forms of radiation commonly found outside earth's atmosphere. Not only are these measures costly in terms of dollars and weight, they are not always completely effective, an obvious drawback given the dangers of space travel.

In view of the foregoing, it is desirable to provide electronic systems which facilitate higher levels of integration, reduce manufacturing complexity, and provide a greater level of reliability in a wider variety of operating environments.

SUMMARY OF THE INVENTION

According to the present invention, electronic circuits and systems based on an all-metal solid-state device referred to herein as a "transpinnor" address the issues discussed above. More specifically, an embodiment of the present invention provides a switch based on the transpinnor which may be used in any larger circuit in which a conventional switch might be employed, e.g., a field programmable gate array.

Thus, the invention provides a transpinnor switch having a network of thin-film elements in a bridge configuration, selected ones of the thin-film elements exhibiting giant magnetoresistance. The switch also includes at least one input conductor inductively coupled to a first subset of the selected thin-film elements, and a switch conductor inductively coupled to a second subset of the selected thin-film elements for applying magnetic fields thereto. The switch is configurable using the switch conductor to generate an output signal representative of an input signal on the input conductor. The switch is also configurable using the switch conductor to generate substantially no output signal regardless of whether the input signal is present.

According to another embodiment, a transpinnor switch includes a network of thin-film elements in a bridge configuration, each of the thin-film elements exhibiting giant magnetoresistance. First and second ones of the thin-film elements form a first path, and third and fourth ones of the thin-film elements form a second path in parallel with the first path. The switch also includes at least one input conductor inductively coupled to the first and third thin-film elements, and a switch conductor inductively coupled to the first and fourth thin-film elements. The network is configurable using the switch conductor to remain resistively balanced without regard to an input signal on the input conductor, and wherein the network is also configurable using the switch conductor to become resistively unbalanced in response to the input signal.

According to various embodiments, one or more transpinnor switches of the present invention is employed to implement various programmable devices and systems including, for example, field programmable gate arrays and field programmable systems-on-chips.

A further understanding of the nature and advantages of the present invention may be realized by reference to the remaining portions of the specification and the drawings.

BRIEF DESCRIPTION OF THE DRAWINGS

FIG. 1b shows a typical resistance curve for a GMR film such as the one shown in FIG. 1a.

FIGS. 2c and 2d show two alternative structures for the multilayer GMR film of FIG. 2a.

FIG. 4 shows a transpinnor with a closed-flux configuration which is substantially the same schematically as the transpinnor of FIG. 3a.

FIG. 5 shows a transpinnor with an open-flux configuration which is substantially the same schematically as the transpinnor of FIG. 3a.

FIG. 9 is a circuit diagram of a transpinnor XOR gate.

FIGS. 10a and 10b show transpinnors to operate as an AND gate and an OR gate, respectively.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

"Giant magnetoresistance" (GMR) refers to the difference in the resistance that conduction electrons experience in passage through magnetic multilayer films which is dependent on the relative orientation of the magnetization in successive magnetic layers. For ferromagnetic materials, this difference occurs because the energy level for conducting electrons in a ferromagnetic layer is lower (by a few electron microvolts) for electrons with spin parallel to the magnetization rather than antiparallel. A GMR film is a composite structure comprising one or more multilayer periods, each period having at least two magnetic thin-film layers separated by a nonmagnetic conducting layer. A large change in resistance can occur in a GMR structure when the magnetizations in neighboring magnetic layers change between parallel and antiparallel alignments.

Figure 1A:
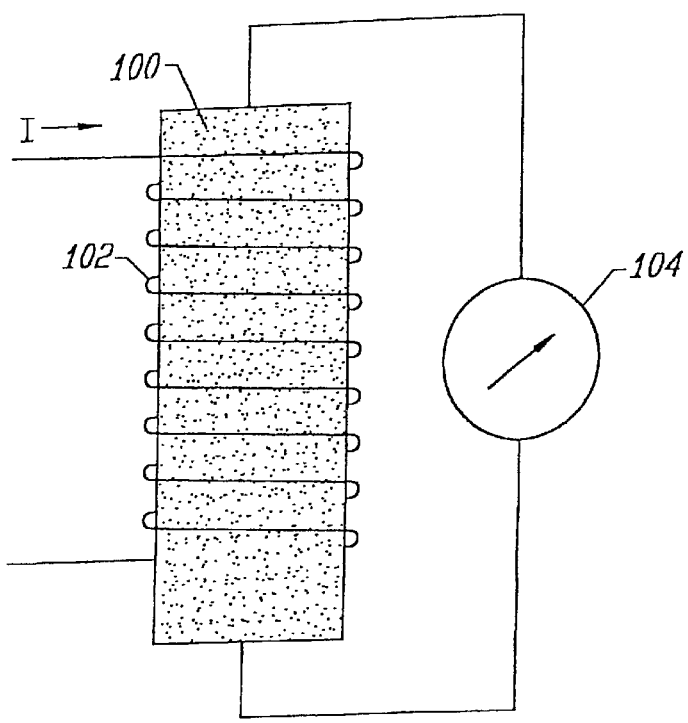
FIG. 1a shows a multilayer GMR film.

The property of giant magnetoresistance may be understood with reference to FIG. 1a which shows a multilayer GMR film 100 with a field coil 102 for supplying a magnetic field to GMR film 100. GMR film 100 contains magnetic layers of different coercivities separated by non-magnetic conducting layers (not shown). An ohmmeter 104 measures the resistance of GMR film 100 which changes as the input current I changes (see FIG. 1b); the dotted line represents the saturation of the high-coercivity film in the opposite direction to the solid line. As discussed above, if the magnetization direction of the magnetic layers of the first coercivity is parallel to the magnetization direction of the magnetic layers of the second coercivity, the resistance of the film is low. If the magnetization directions are antiparallel, the resistance is high.

Figure 1B:
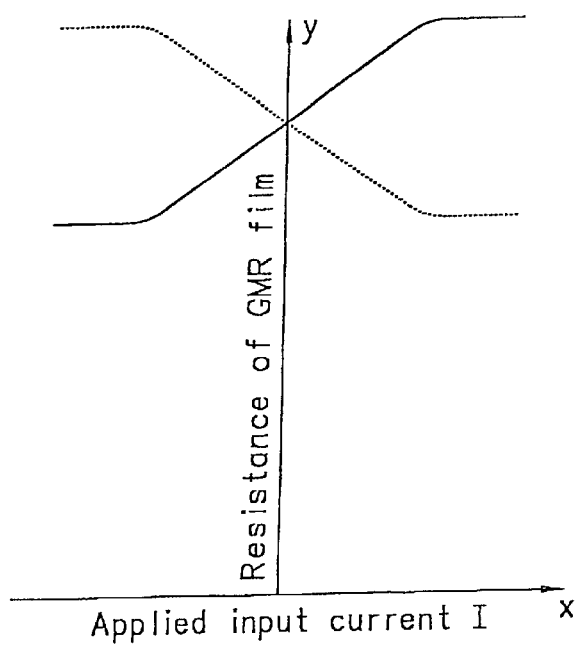

GMR film 100 may be formed of one or more periods, each period having, for example, a cobalt layer characterized by a moderate coercivity, a copper layer, a permalloy layer characterized by a lower coercivity than the cobalt layer, and another copper layer. The different coercivities of the alternating magnetic layers make it possible to achieve an antiparallel orientation of the respective magnetization directions. The copper layers physically separate the magnetic layers, which otherwise would be tightly coupled by exchange forces. Consequently, it is possible to switch the magnetization in the low coercivity film without switching the magnetization in the high coercivity film. FIG. 1b shows a hypothetical resistance curve for an input current I which is not sufficient to reverse the polarity of the higher coercivity cobalt layer. As the current is increased, more of the low coercivity film switches, thus increasing the resistance. When the entire low coercivity film is switched there is no further change in resistance and the resistance curve levels off.

Figure 2A:
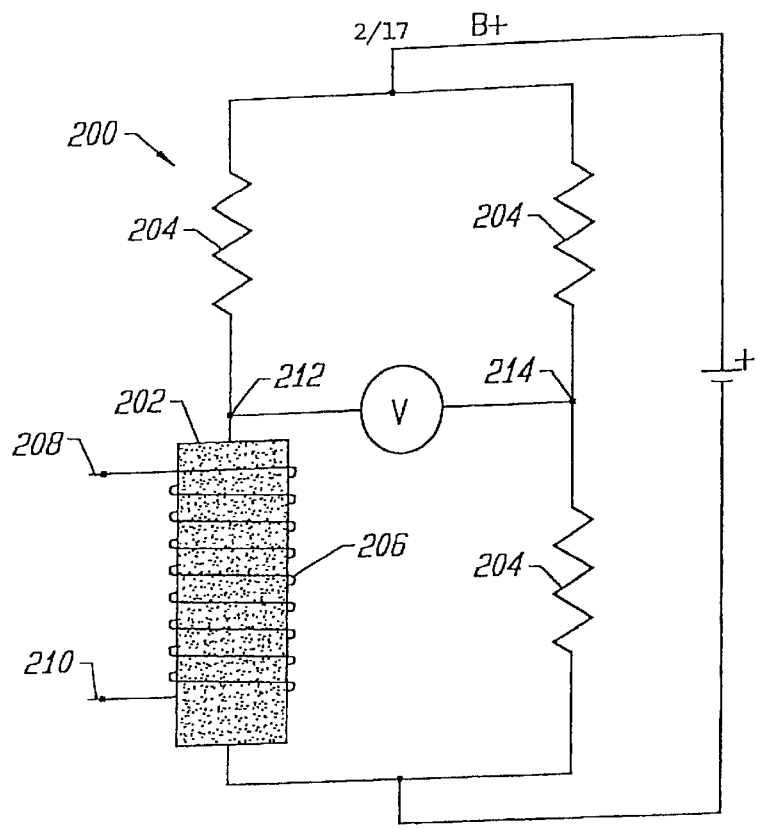
FIG. 2a is a schematic diagram of a first transpinnor configuration.
Figure 2B:
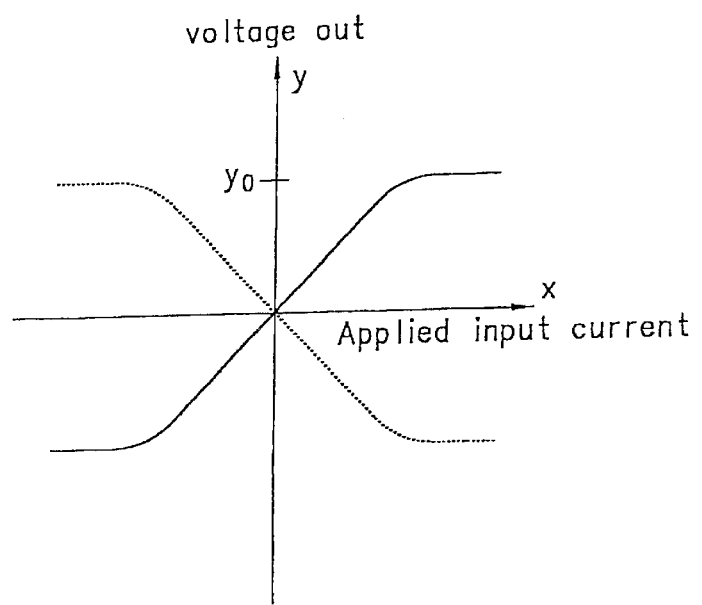
FIG. 2b shows a plot of the output voltage of the transpinnor of FIG. 2a as a function of input current.
Figure 2D:
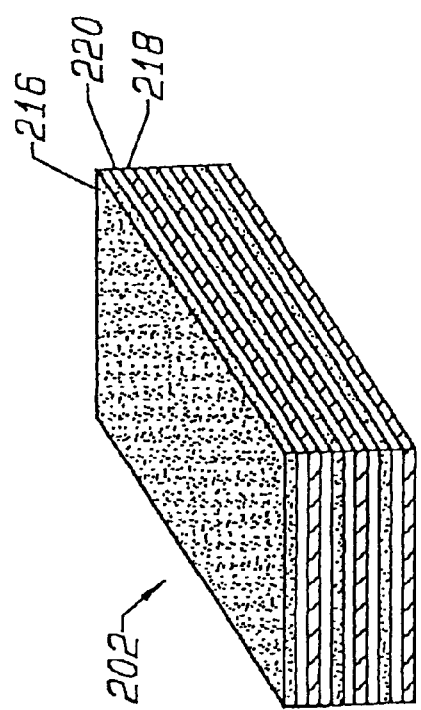
Figure 2C:
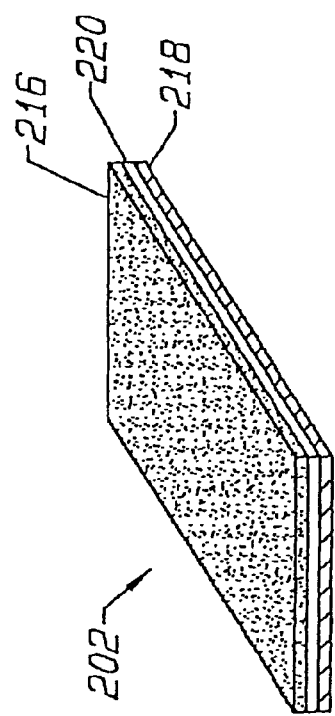

FIG. 2a shows a schematic diagram of a transpinnor 200 in which a GMR multilayer thin-film strip 202 is disposed in a bridge configuration with three resistive elements 204. A conductor 206 is wound around GMR film 202 for supplying a magnetic field thereto. An input signal is applied at terminals 208 and 210. Output terminals 212 and 214 give the output voltage, as indicated by a voltmeter. This configuration allows the output voltage to be zero as well as positive and negative. As is readily apparent, the input (between terminals 208 and 210) is completely isolated resistively from the output (between nodes 212 and 214) even for a DC input current I. The magnitude of the output is proportional to the applied B+ voltage and is limited only by the current carrying capacity of GMR film 202. FIG. 2b shows the output voltage of transpinnor 200 as a function of input current. If the values of resistors 204 are chosen correctly, the output voltage does not have a pedestal. That is, the curve crosses the y axis at y=0, and is not raised as in FIG. 1b. If the high coercivity film is reversed by either a strong input current or an external field, the polarity of the output is reversed, as shown by the dotted line in FIG. 2b. A single-period GMR film 202 and a three-period GMR film 202 are shown in FIGS. 2c and 2d, respectively, each having permalloy (216), cobalt (218) and copper (220) layers. The GMR films of FIGS. 2c and 2d illustrate that various transpinnor configurations may employ single period and multi-period structures.

As mentioned, the output of transpinnor 200 changes as the resistance of GMR film 202 changes and is proportional to the voltage drop across GMR film 202 as the current passes through it. The output can be bipolar or unipolar, depending on the ratios of resistances chosen for the other legs (i.e., the bias can be positive, negative, or zero). Also, depending on the squareness of the B-H loop, the output can either be linear or a threshold step function. In addition, if the GMR film 202 is constructed symmetrically about the center, the net magnetic field from the current passing through the film will be zero. Therefore, the only limits on magnitude of the current are the heating of GMR film 202 and/or electromigration. The GMR films may employ metals having high electromigration thresholds, such as copper, cobalt, nickel and iron.

Figure 3A:
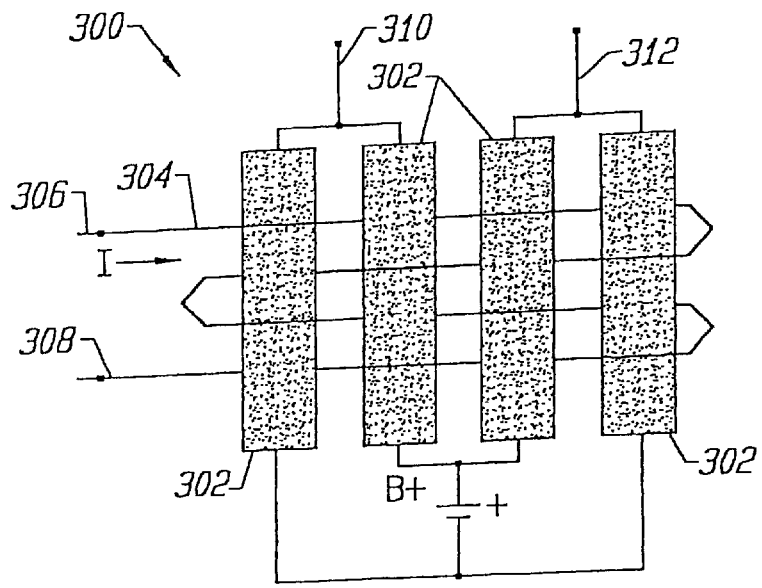
FIG. 3a is a schematic diagram of a second transpinnor configuration.
Figure 3B:
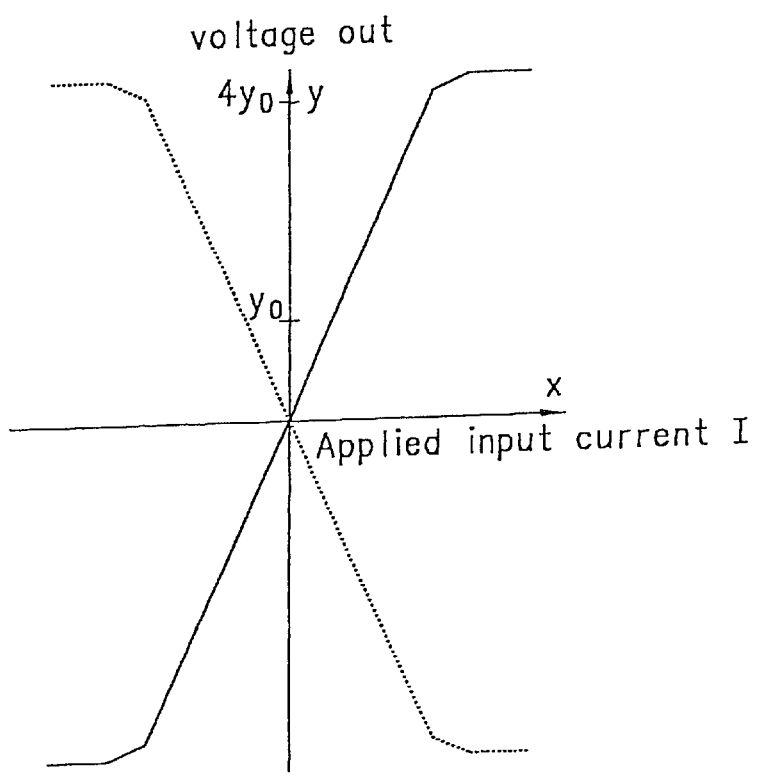
FIG. 3b shows a plot of the output voltage of the transpinnor of FIG. 3a as a function of input current.

FIG. 3a shows a schematic diagram of another transpinnor 300 having a different configuration. Instead of only one GMR film, transpinnor 300 employs four GMR films 302 arranged in a bridge configuration with conductor 304 wound through them for supplying a magnetic field thereto. As with transpinnor 200, the input of the device (between terminals 306 and 308) is isolated resistively from the output (between nodes 310 and 312) even with a DC input current. Also, the output voltage of transpinnor 300 is determined by the magnitude of B+ and the current carrying capacity of GMR films 302. As shown in FIG. 3b, transpinnor 300 has four times the output of transpinnor 200. Transpinnor 300 also has the advantage that the bridge is balanced to zero offset if all four films are identical.

Figure 4:
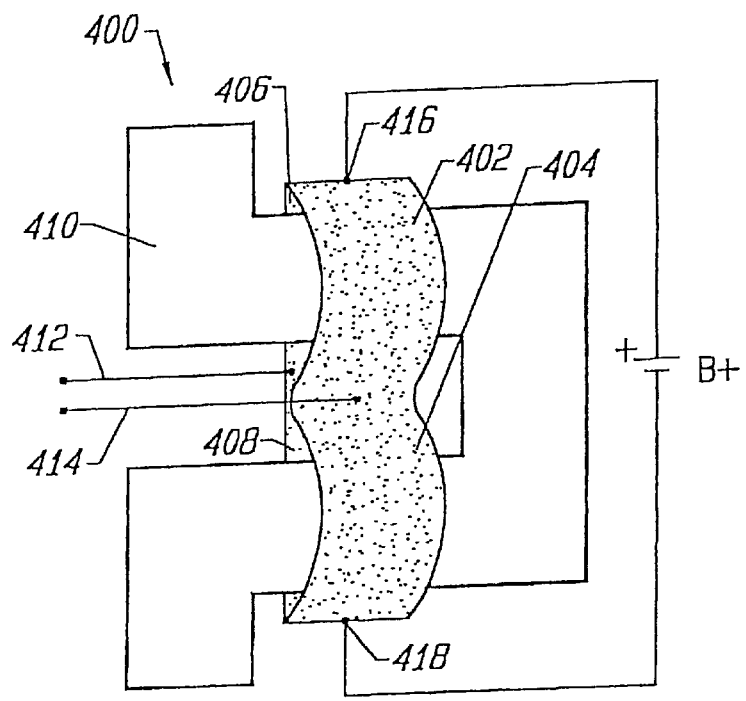

FIG. 4 shows a transpinnor 400 with a closed-flux geometry which is substantially the same schematically as transpinnor 300. There is insulation (not shown) in the middle of transpinnor 400 where top GMR films 402 and 404 nearly touch bottom GMR films 406 and 408. The four GMR films form a Wheatstone bridge in which the resistance of each is variable. Input conductor 410 supplies the magnetic field and the output voltage is provided by output conductors 412 and 414. A bias voltage B+ is applied between nodes 416 and 418.

Figure 5:
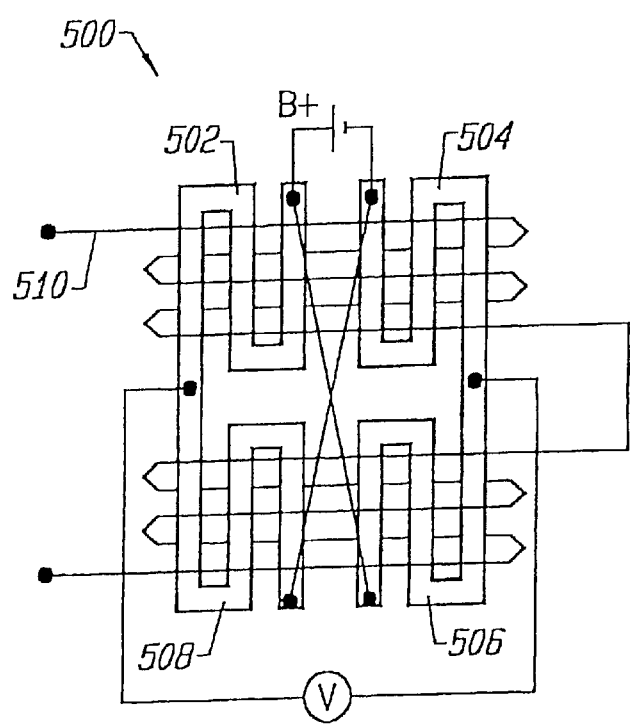

FIG. 5 shows a transpinnor 500 with an open-flux configuration which is substantially the same schematically as transpinnor 300. GMR film elements 502, 504, 506 and 508 form a Wheatstone bridge arrangement which requires only a single GMR deposition (i.e. the GMR layers are deposited in a single pump-down, with no patterning required between deposition of layers). Input conductor 510 was wound as a single layer of magnet wire. The closed-flux structure of FIG. 4 gives superior performance, especially for small-size devices, but involves multiple GMR depositions and patterning.

Figure 6:
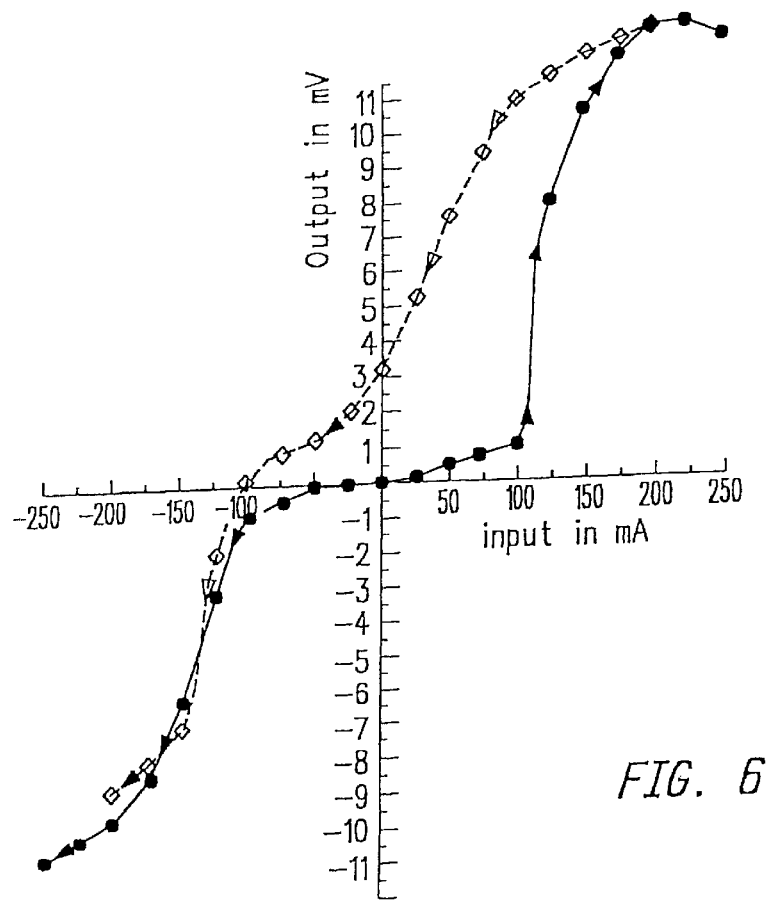
FIG. 6 illustrates the relationship between input current and output voltage for an all-metal GMR transpinnor.

FIG. 6 illustrates the relationship between input current and output voltage for the all-metal GMR transpinnor shown in FIG. 5. The transpinnor was first initialized by saturating its four GMR film elements along the easy axes (i.e., parallel to the direction of film strips) with a magnet, and then applying input current until the magnetization direction of the permalloy layers in two of the elements switch completely (i.e., for maximum output from a Wheatstone bridge two resistors must be in the high resistance state and two in the low resistance state). After initialization in this manner, the data for the curve of FIG. 6 were taken. The solid curves, both positive and negative, were taken starting from the initialized state. The dashed curve is the remagnetization curve in which the applied field is made more negative (starting from the state of maximum output) in order to reestablish the initial magnetization state.

The solid curve of FIG. 6 shows a flat portion near the origin, then a rapid climb in output voltage when the input current reaches a threshold. It will be understood that this flat portion and threshold are desirable for digital applications, such as logic or selection matrices. The flat portion of the curve is largely due to the exchange bias between the permalloy and the cobalt layers. For linear applications, this portion of the curve can be removed either by the application of a small external bias, or by creating a symmetrical spin valve structure in which two cobalt layers are magnetized in opposite directions.

Figure 7:
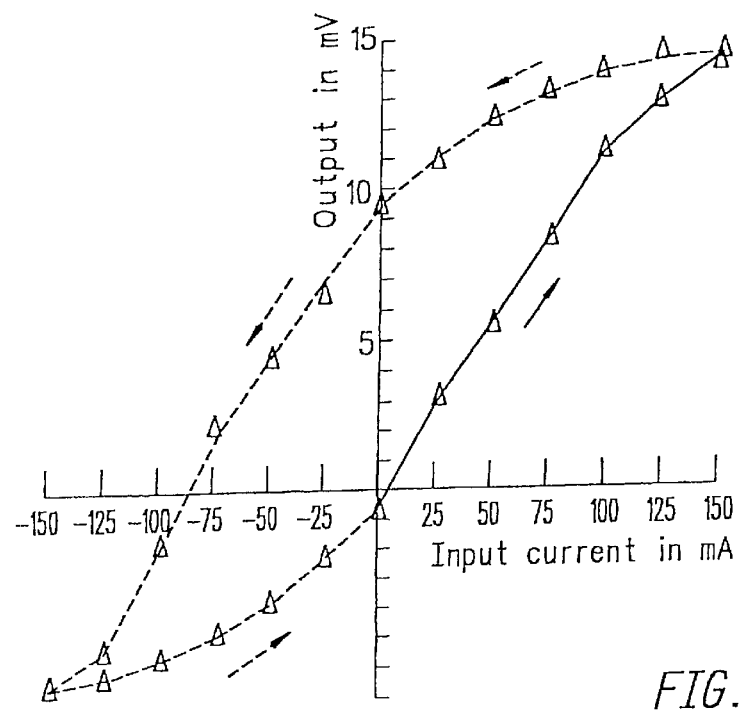
FIG. 7 shows output voltage vs. input current for the GMR transpinnor of FIG. 6 with a small external bias applied.

FIG. 7 shows an output voltage vs. input current curve for the GMR transpinnor of FIG. 6 but with a small external bias (e.g., 1.5 Oe) applied with a magnet in the easy direction (i.e., parallel to the film strips). As is evident, the exchange bias plateau around the origin has been essentially eliminated. As with FIG. 6, the solid lines begin with the initialized state, and the dashed line is the remagnetization curve. The finite hysteresis makes this transpinnor better suited for digital than for linear applications.

The GMR transpinnor of FIG. 6 has a rather large hysteresis in the permalloy of 1 Oe. However, permalloy coercivities of an order of magnitude smaller are found. This is of interest because the voltage and current gain of the GMR transpinnor are inversely proportional to the permalloy coercivity, and the power gain is inversely proportional to the square of the permalloy coercivity. The permalloy coercivity found in multi-period GMR films is routinely much lower than single-period GMR films. The reason is that the domain walls form in pairs in the closely spaced films of the multi-period devices, greatly reducing the magnetostatic energy of the walls. This is beneficial for linear applications because it increases the gain of the transpinnor. Unfortunately, a corresponding reduction in the coercivity of the cobalt layers is also found. This reduction is undesirable because at some point the magnetization direction of the cobalt layers begin to switch at a lower threshold than the magnetization direction of some of the permalloy layers. Obviously, the proper balance between these two parameters must be found for the particular application.

It is desirable in particular applications for the GMR transpinnor to have a gain greater than unity. The low-frequency gain of GMR transpinnors is a function of their fundamental parameters. Referring again to FIG. 5, input line 510 of transpinnor 500 is completely isolated from the output circuit. For the purpose of calculating the gain of transpinnor 500, let the input current be i, the input voltage be v, and the resistance of the input line be r. Furthermore, let the output voltage of transpinnor 500 be V, the resistance of the output circuit (including the GMR film) be R, and the current be I. Let us also introduce a variable to express the ratio of the percentage change in resistance caused by a small applied magnetic field. Where the shear is unimportant compared to the coercivity, this quantity, which we call the resistibility, X, is given by $$X = GMR/(100 H_c) \tag{1}$$

where $H_c$ represents the coercivity of the permalloy in the GMR film. The voltage gain of the GMR transpinnor of the present invention is proportional to the resistibility, and the power gain is proportional to the square of the resistibility.

The input line of the transpinnor produces a field. The ratio of field to the current by which it is produced is referred to herein as the coil efficiency, E. Generally speaking, the value of E increases dramatically as the size of the transistor decreases. If other parameters (including the resistance of the input line) stay the same, the voltage amplification is proportional to E, and the power amplification is proportional to the square of E.

Given the definitions of the various parameters of the transpinnor, the voltage amplification is given by $$A_{voltage} = (R/r) I\, E\, X \tag{2}$$

and the power amplification is given by $$A_{power} = (R/r) I^2 E^2 X^2 \tag{3}$$

From (1) and (3) it becomes evident that the power amplification of transpinnor 500 is proportional to the square of the current, to the square of the GMR, to the square of the drive line efficiency, and inversely proportional to the square of the coercivity of the GMR film.

Some numerical examples of power amplification may be instructive. According to a first example, the input resistance is 0.8 Ohms, the resistance of the GMR film elements is 120 Ohms, the resistibility is 0.011/Oe, and the coil efficiency is 20 Oe/amp. If an input current of 500 mA is used, according to (3), the power amplification is 1.8. This is not a particularly good film.

According to a second example, the parameters are the same as for the first example above, except that the resistibility is 0.19/Oe. Now the power amplification is 541. This is higher than desirable for a logic tree, but may be reduced to a desirable value by appropriately decreasing the current.

According to a third example, a miniaturized transistor is configured as shown in FIG. 4, with the width of its features being on the order of one micron. The copper input conductor is 1 micron thick and 3 microns long. The input resistance is 0.05 ohms, the output resistance is 8 ohms, the coil efficiency is 6000 Oe/amp, the resistibility is 0.19/Oe, and the current is 1 mA. The power amplification is then 208.

The conclusion is that substantial power amplification can be achieved with GMR transpinnors using existing GMR film configurations. Additionally, amplification factors in the hundreds can be obtained regardless of whether the transistors are large or so small as to be at the limits of conventional lithography because the power amplification factor is independent of the size of the device. However, although GMR transpinnors scale so their power amplification doesn't degrade when the devices are miniaturized, the power handling capability of the devices diminishes, of course, as the device size diminishes. GMR transpinnors can be designed to give either high output current and low output voltage, or high output voltage and low output current. These parameters are determined by the aspect ratio of the GMR film. If the GMR film is a long narrow conductor, the output is high voltage and low current. If the GMR film is a short wide conductor, the output is low voltage and high current. The power amplification is relatively independent of the aspect ratio.

To get high power amplification, the following may be done:

(1) Make the input stripline as thick as possible in order to lower the resistance r. The power amplification depends only linearly on r, so this is less critical than the other steps.

(2) Make the resistibility as high as possible, either by raising the GMR or by lowering the coercivity of the permalloy.

(3) Make the GMR films as thick as possible to allow higher current without electromigration problems. This means many periods (e.g., 15 periods have been employed to obtain GMR of 15%).

Although low GMR films with very low coercivity can be used to construct GMR transpinnors with high power amplification, the resulting device may be inefficient. If overall power consumption is a consideration, one should use high GMR films. It is possible, for example, to make GMR films with GMR of more than 22%.

There are a wide range of applications for which the transpinnor represents a significant advance. For example, transpinnors may be employed to implement nonvolatile logic gates, i.e., gates which maintain their states when power is removed. Additionally, because all-metal films exhibit much greater resistance to damage by radiation than semiconductors, transpinnors may be employed to implement intrinsically radiation-hard electronics.

The curve shown in FIG. 7 exhibits hysteresis. Although this is not harmful (and may indeed be useful) for logic devices, for linear transpinnor performance, the hysteresis loop needs to be closed and straightened in a finite operating region; additionally, films with very low-coercivity should be used. In general, the shape of the hysteresis loop of thin films depends on the direction of the applied fields. Different approaches to achieve anhysteretic GMR films for transpinnor operation in the linear region based on three methods of eliminating hysteresis and distortion from GMR films are described. One approach is the application of a transverse (i.e., perpendicular to the easy direction) bias field having a magnitude slightly larger than the anisotropy field of the low coercivity element; the signal to be amplified is applied as a varying easy-axis magnetic field. This bias field can be supplied by an external coil or magnet, by individually deposited magnets on each amplifier, or by a current in a stripline. The effect of the bias is to eliminate the hysteresis and to greatly increase the longitudinal permeability, as described in two publications, *Longitudinal Permeability in Thin Permalloy Films*, E. J. Torok and R. A. White, Journal of Applied Physics, 34, No.4, (Part 2) pp. 1064–1066, April 1963, and *Measurement of the Easy-Axis and $H_k$ Probability Density Functions for Thin Ferromagnetic Films Using the Longitudinal Permeability Hysteresis Loop*, E. J. Torok et al., Journal of Applied Physics, 33, No. 10, pp. 3037–3041, October, 1962, the entire disclosures of which are incorporated herein by reference for all purposes. The mathematics in these publications can be used to show that when a GMR film of resistance R, having one or more low coercivity layers (e.g. permalloy) with anisotropy field $H_k$, is biased with a hard axis field $H_T > H_k$, and to which a small easy axis field $dH_L$ is applied, the film will have a corresponding resistance change, dR, given by $$dR/dH_L (GMR) R/(H_T - H_k) \qquad (4)$$

where GMR is the maximum resistance change, and $H_T$ must be larger than the maximum $H_k$ of any region of the film. This differential resistance change can be quite large if the inhomogeneity of the film is small, and the corresponding amplification can be large. This is a sensitive method of achieving anhysteretic GMR films by a transverse-biased permeability. It results in an analog signal with a linear response within a certain range.

In another approach to eliminating the hysteresis, the permalloy layer in the transpinnor is driven and sensed in the hard direction. The cobalt layer is deposited so that its easy axis is parallel to the hard axis of the permalloy, this is accomplished by saturating the cobalt layer during its deposition at 90 degrees from the easy axis of the permalloy. This method does not generally require a bias field during operation; the exchange bias between the high coercivity layer(s) and the permalloy layer is normally sufficient to prevent the hard-axis loop from opening. The sensitivity of the hard-axis-driven film is not as good as in the approach based on the transverse-biased permeability (described above), but the linearity extends over a broader range and this method is easier to implement in that it avoids biasing in the hard direction and driving in the easy direction.

Yet another approach involves a sampling method. A pulse is applied to the transpinnor between each data sample. The pulse is of sufficient amplitude to saturate the permalloy layers in the transpinnor to an initial state that is the same regardless of whatever signal was applied in between. The frequency of the applied pulse should be higher than the highest frequency of interest in the signal to be amplified. The result of using narrow pulses to reinitialize the magnetic material before each data sample is to erase the magnetic history and to eliminate the hysteresis in the output. The output can be sensed either with sampling techniques or as an analog output with a low-pass filter.

It is generally understood that all possible electronic circuits, analog and digital, can be implemented using active components, e.g., transistors, in combination with four basic passive components, i.e., resistors, capacitors, inductors and transformers. It is also well known that neither inductors nor transformers are available in semiconductor bipolar technology. By contrast, the GMR transpinnors can be employed to provide both of these components. In fact, they are well suited to provide the basis of a variety of analog, digital and mixed general-purpose all-metal circuits, subsystems and systems. Since capacitance and resistance can be implemented with the same metal technology as that used for the passive transformer and the transpinnor, all these components can be combined very effectively on the same substrate to produce a comprehensive variety of all-metal circuits. Unlike semiconductor chips, whose performance suffers below a critical size, the characteristics of GMR devices improve as the dimensions are decreased.

Biased in the appropriate operating region, GMR transpinnors can be used as basic building blocks of logic gates, thereby providing the foundation for GMR-based digital electronics. While logic elements can be made with combinations of transpinnors, just as with transistors, there is another alternative. Various logic operations can be implemented with a single transpinnor. These transpinnors have more than one input line. Examples of such transpinnors are shown in FIGS. 8 and 9.

Figure 8:
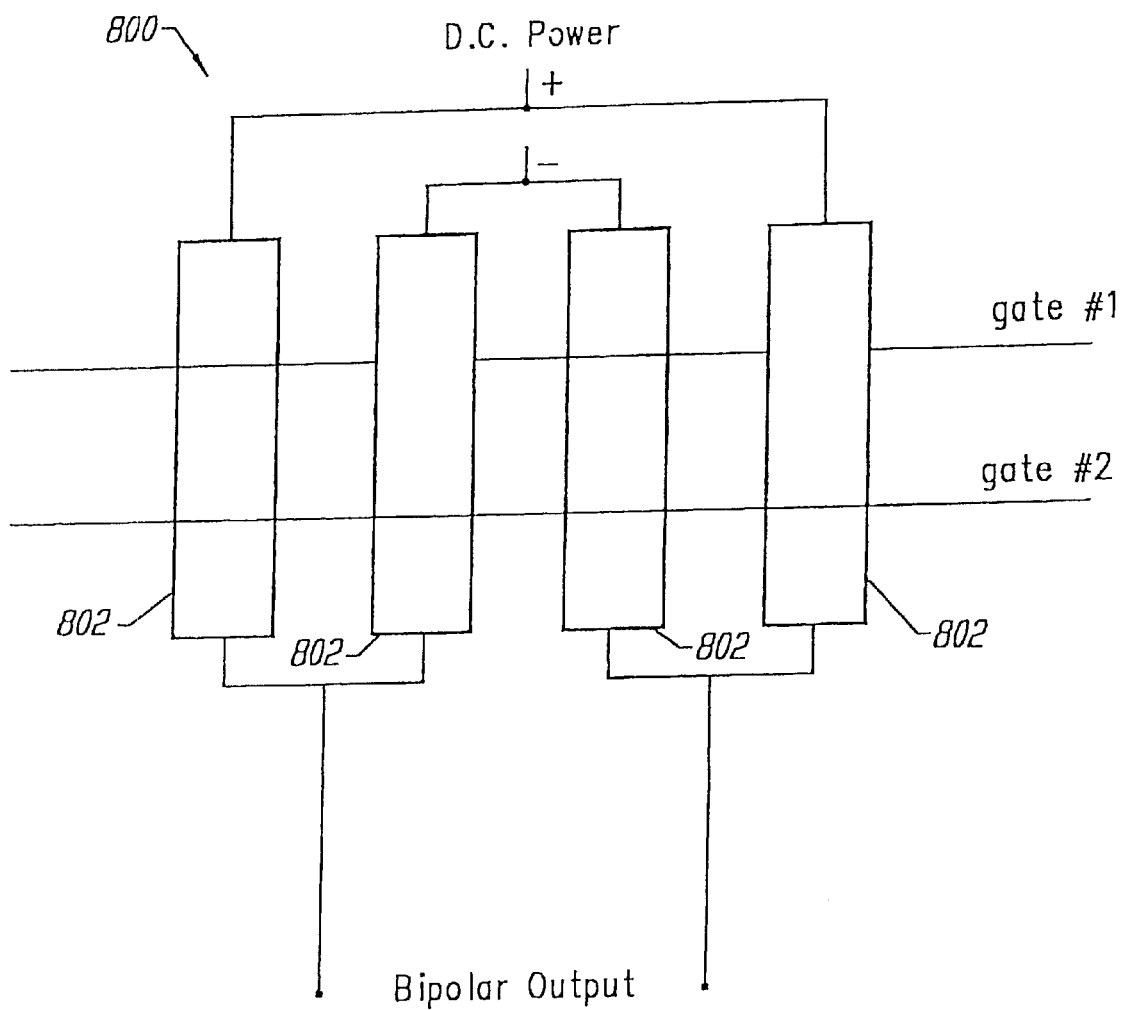
FIG. 8 shows a multiple-input transpinnor configuration.

FIG. 8 shows one such all-metal GMR transpinnor 800 and two drive lines. Four GMR films 802 are tied together in a folded Wheatstone bridge configuration. Each GMR film 802 is shown as a rectangular strip with its easy axis oriented in the long direction. Flux closure is also along the easy axis, but is not shown. The two drive lines (gates #1 and #2) are deposited conductor strips. The application of current on gate #2 tends to magnetize all four GMR films in the same direction. The application of current on gate #1 tends to magnetize adjacent GMR films oppositely. With the proper pulse combinations one can use half-select pulses to magnetize the high-coercivity layers positively or negatively in one direction, or to magnetize alternate strips in alternate directions.

As mentioned above, when a transpinnor is balanced, its output is zero. An input current which exceeds the threshold for switching a lower-coercivity layer in one or more of the GMR films can change the film resistance, thus unbalancing the transpinnor, resulting in an output signal. Particular types of logic gates can be realized from the basic transpinnor by specific configurations of input lines and by suitable choices of input current values. Additional characteristics affecting the operation of transpinnor logic gates include the choice of resistors through which a given input current passes, the current polarities in selected resistors, and the direction of the magnetic field produced by the input current relative to the magnetization of the lower-coercivity layers in the transpinnor.

Two procedures are useful in implementing logic gates with a single transpinnor. One involves setting the transpinnor threshold which is determined by the coercivity of the low-coercivity layers in the GMR film. Various ways of establishing the coercivity of a thin film are known in the art. Thus, the threshold is set by choosing or adjusting the coercivity of at least one of the low-coercivity layers in the GMR films of the transpinnor. The other procedure involves switching the polarity of the GMR films which is determined by the magnetization orientation of all the film layers. The polarity of the transpinnor is thus switched by reversing the direction of magnetization of all layers of all GMR films in the transpinnor.

According to various embodiments, the balancing of transpinnor GMR elements is accomplished using a technique known as magnetoresistive trimming in which the magnetization of selected GMR elements are manipulated to achieve the desired balance. Magnetoresistive trimming techniques are described in International Publication No. WO 02/05470 A2 entitled MAGNETORESISTIVE TRIMMING OF GMR CIRCUITS published Jan. 17, 2002, the entire disclosure of which is incorporated herein by reference for all purposes.

Logic operations which can be implemented with a single transpinnor include the following:

AND gate: A transpinnor will not switch unless the sum of fields from the input lines exceeds the switching threshold. An AND gate is defined as one that yields no output unless all of its inputs are logical "1"s. If the transpinnor has n input lines, and the amplitude of each input pulse is $(1/n)^{th}$ of the threshold, then the transpinnor is an AND gate.

NAND gate: This is the inverse of the AND gate and gives an output if and only if all inputs are zero. A transpinnor NAND gate is made similarly as the AND gate, by reversing the magnetization of all elements so that the gate will just switch if all n inputs are logical "0"s and not switch if one or more are a logical "1".

OR gate: The definition of an OR gate is one that gives an output if one or both inputs are a "1". This can be made by setting the threshold of a transpinnor such that a single input is sufficient to switch the film.

A practical problem is presented by the fact that different switching thresholds are required for different single transpinnor logic gates. There are, however, a variety of ways in which these thresholds may be adjusted for different types of gates on the same substrate. These include manipulation of the order of deposition because the order strongly influences to the coercivity of both the low and high coercivity films. This method involves additional deposition steps. Another method of adjusting the switching threshold for a particular transpinnor is derived from the fact that the magnetic field from a current carrying stripline depends on the width of the strip line.

NOR gate: The definition of a NOR gate is one that gives an output if one or both inputs are a "0". This is merely the inverse of an OR. This can be done by reversing the polarity of the GMR films as in the above case of a NAND.

NOT gate: A NOT gate is an inverter that changes the polarity of an input pulse from positive to negative and vice versa. This is easily done with a transpinnor by reversing the polarity of the input winding, or by interchanging the power terminals.

Exclusive OR (XOR) gate: This is a gate that gives an output if one and only one of the inputs is a "1". This can be done with a transpinnor such that one input is sufficient to switch the low-coercivity element, yielding an output, while two or more pulse inputs yield a field large enough to switch the high-coercivity element as well, yielding zero output. The gate must be reset after each use.

A circuit diagram of a transpinnor-based XOR gate 900 is shown in FIG. 9. As shown, input current 1 goes through resistors R1 and R3 and input current 2 goes through resistors R2 and R4. If the currents in both inputs are less than the switching threshold, the output is zero. If the current in one and only one of the two input currents is above this threshold, then the resistance of either pair of resistors changes, the transpinnor becomes unbalanced, and an output signal is generated. If both input currents are above the switching threshold, all four resistors change equally (if properly trimmed), the transpinnor remains balanced, and the output signal is zero.

A circuit diagrams for other transpinnor configurations are shown in FIGS. 10*a* and 10*b* which, according to various embodiments, are used to implement AND and OR gates. Unlike XOR gate 900 in which one input goes through GMR elements R1 and R3 where the other goes through R2 and R4, both inputs for AND gate 1000 and OR gate 1050 go through all four elements. Referring now to FIG. 10*a*, AND gate 1000 is configured to function as an AND gate by selecting the current polarities such that the current from input 1 runs opposite to the current in input 2 through R2 and R4, and in the same direction through R1 and R3. If the currents in both inputs are less than half the switching currents, all four GMR elements remain unchanged, the transpinnor remains balanced, and the output of gate 1000 is zero.

If the current in one, and only one, input is above the switching threshold, all four GMR elements change equally, the transpinnor remains balanced, and the output of gate 1000 is zero. If, on the other hand, the currents in both inputs are above the switching threshold (and thus the net current through R2 and R4 is below the switching threshold), the transpinnor becomes unbalanced and gate 1000 produces an output signal.

Referring now to FIG. 10*b*, operation of gate 1050 as an OR gate is achieved because the input lines generate magnetic fields in GMR elements R1 and R3 opposing the directions of the magnetization vectors in the lower-coercivity layers of these elements, and magnetic fields in R2 and R4 in the same directions as the magnetization vectors in the lower-coercivity layers of these elements. With such a configuration, a sufficiently large current through R1 and R3 will change their resistances but not the resistances of R2 and R4, unbalancing the transpinnor and thereby producing an output.

If currents in both inputs are less than half the switching current, all four GMR elements remain unchanged, the transpinnor remains balanced, and the output of OR gate 1050 is zero. However, if the current in either or both of the inputs are above the switching current, the resistances of elements R1 and R3 change while those of R2 and R4 remain the same, the transpinnor becomes unbalanced, and OR gate 1050 generates an output signal. It will be understood that the net current through R2 and R4 should not be sufficient to produce a magnetic field which could switch the lower-coercivity layers of these elements.

For digital applications, transpinnors with sharp thresholds and square-pulse outputs are desirable. For analog applications, a linear response is better. Transpinnors operating in the linear region can be used to develop a full complement of basic analog circuits, sufficient to create general-purpose analog circuitry based on GMR films.

A specific example of a transpinnor operating in the linear region for application to signal amplification illustrates some of the unique advantages of the dual functionality of the transpinnor over silicon technology. Differential amplifiers are typically used to eliminate common-mode signal and common-mode noise within the frequency range of their operation. As discussed above, the range of operation of the transpinnor in its transformer function extends from (and including) dc to the high-frequency cutoff limit. The GMR transpinnor can advantageously be utilized in its transformer function to remove common-mode signal in the differential-input mode, as well as in its transistor function to amplify a low signal in the single-ended output mode. In low-signal amplification, GMR transpinnors have the additional advantage of eliminating the problem of offset voltage at the input that is so troublesome in silicon integrated circuits. It should be noted that a high premium is paid in silicon technology to achieve low-offset input voltage for integrated differential amplifiers. That is, low-offset input voltage is achieved in silicon circuits only at the expense of degrading other parameters. No such price is associated with the use of transpinnors because of their dual transformer/transistor properties. Specifically, the input signal is applied to a differential input having the properties of a transformer primary with an additional advantage of flat low-frequency response inclusive to dc. The output signal is amplified by an output having transistor properties. Transpinnors are thus especially well suited as differential amplifiers.

Figure 11:
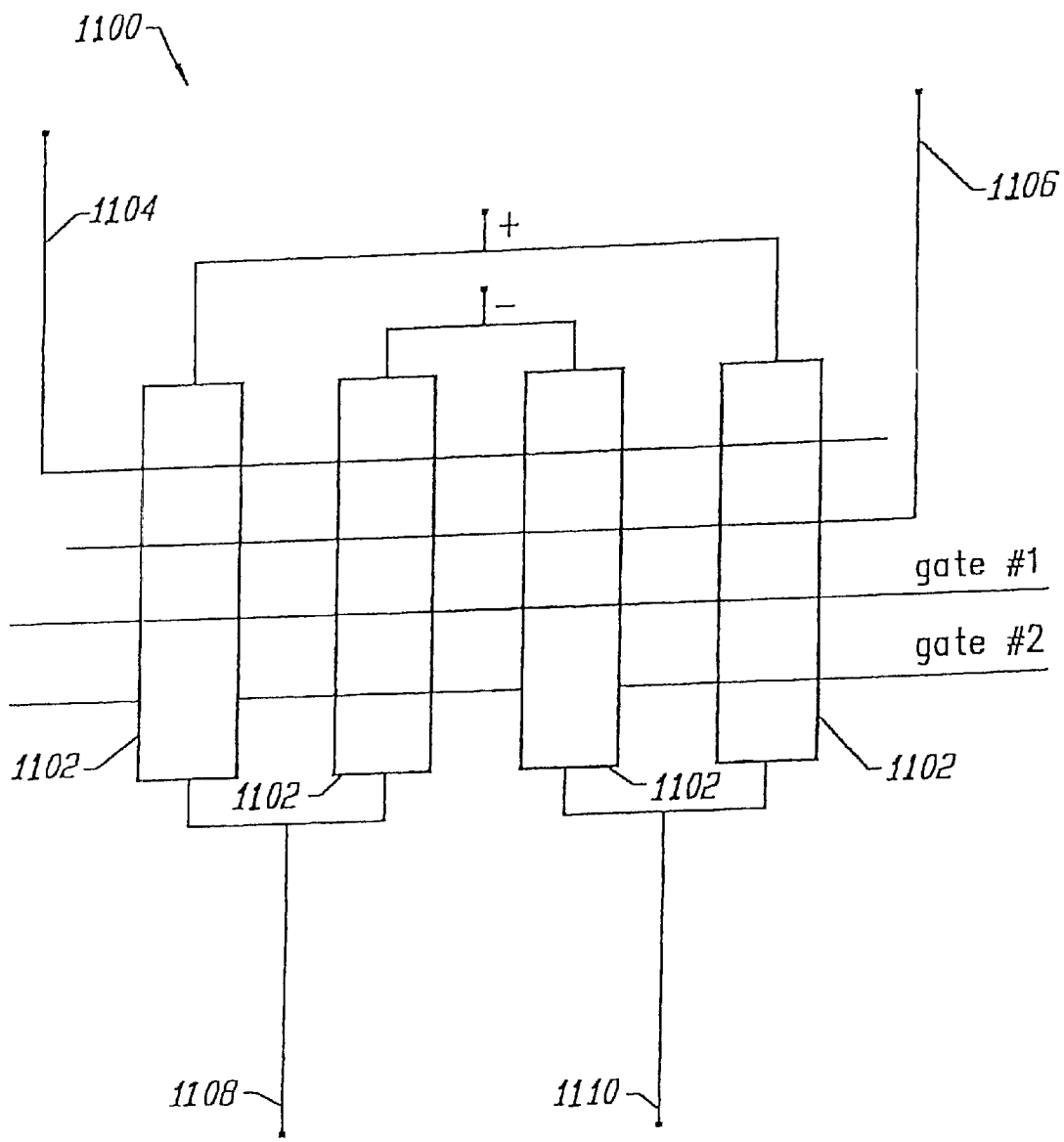
FIG. 11 shows a transpinnor configured as a gated GMR differential amplifier.

FIG. 11 shows a gated GMR differential amplifier 1100. Once again, four GMR films 1102 are arranged in a Wheatstone bridge configuration. Two input lines 1104 and 1106 supply a switching field to the permalloy layers in GMR films 1102. If the signals on lines 1104 and 1106 are identical, no switching takes place and the output (between nodes 1108 and 1110) is zero. Any common mode noise is thus rejected. All four lines (gate lines #1 and #2 and input lines 1104 and 1106) are electrically isolated, i.e., there is no electrical connection between them or to GMR films 1102 in gated differential amplifier 1100.

Since transpinnors are current driven devices, an important parameter is the output current of a given transpinnor for a given input current. This determines whether one transpinnor can switch another, for example, or how much amplification can be achieved. Of particular interest is the dependence of the amplification factor $A = i_{out}/i_{in}$ on the power supply to the transpinnor and on its parameters. This relationship is given by:

$$A = \pi 1000 gmr\, VL/(H_c w^2 R_{sq}) \tag{5}$$

where V is the power supply voltage in volts, gmr is the fractional GMR value of the film (i.e., the GMR value is normally quoted as a percentage), $H_c$ is the coercivity in Oe, w and L are the GMR strip width and length in microns, and Rsq=r/(L/w) is the sheet resistivity in ohms per square of a GMR film with resistance r (ohms per square is a standard term in thin film technology because the resistance from edge to edge of a thin film square is independent of the size of the square).

The field H produced by $i_{in}$ in a stripline of width w is given by:

$$H = 2\pi i_{in}/w \tag{6}$$

and $i_{out}$ is given by:

$$i_{out} = 10^3 gmr\, v/(2r) \tag{7}$$

where H is in Oe, $i_{in}$ and $i_{out}$ are in mA, w is in microns, and V is in volts.

Many transpinnor-based devices require one transpinnor to switch another transpinnor. Examples include a transpinnor shift register, a transpinnor selection matrix, and a transpinnor multistage amplifier. When a transpinnor is used to switch another transpinnor, the output current of the switching transpinnor becomes the input current of the transpinnor to be switched. A single transpinnor can readily switch multiple transpinnors as shown by the following numerical examples of the performance characteristics of several transpinnor-based devices:

1) shift register: In a transpinnor shift register, one transpinnor switches an identical transpinnor which, in turn, switches another identical transpinnor, an so on. An amplification factor of 1 is required. For w=L=5 microns, $H_c=1$ Oe, gmr=0.06, and $R_{sq}=6$ ohms per square, a power supply voltage of 0.168 is required (see equation (5)).

2) amplifier: For a power supply voltage of 3 volts on a chip, with the other parameters the same as for example 1 above, the amplification factor is 18.

3) branching logic: For the same parameters as in example 2, one transpinnor can switch a total of 18 other transpinnors.

4) smaller transpinnors: If, from the examples above, w and L were both reduced by a factor of 5 to 1 micron, the required voltage for an amplification factor of 1 would also be reduced by a factor of 5 to 33.6 mV. Thus, for a 3 volt supply, an amplification factor of 90 can be achieved.

5) different aspect ratios: For L=5 microns (as in example 1) and w=1 micron, the required voltage for an amplification factor of 1 is reduced to 6.7 mV.

6) single-transpinnor comparator design: a comparator is a high gain differential amplifier, easily saturated, e.g., FIG. 11; For L=10 microns, w=1 micron, V=0.2 volt, Hc=1 Oe, gmr=0.06, and Rsq=6 ohms/sq for the GMR films, the amplification factor is 63 according to equation (5), and the output current of the comparator is 0.1 mA according to equation (7). For decoder logic with w=0.5 micron, the magnetic field applied to the decoder logic is 1.26 Oe according to equation (6), large enough to drive the decoder logic.

7) comparator power dissipation: For the same parameters as in example 6, the resistance of each GMR element of the transpinnor is 60 ohms. This is the effective resistance between the power supply and ground of the transpinnor. For a supply voltage of 0.2 volt, the power dissipation of the comparator is $\{(0.2 \text{ volts})^2/60 \text{ ohms}\}=0.67$ mW.

The foregoing examples illustrate that even transpinnors with modest GMR values can achieve enough gain to perform the analog and logic functions required to implement a wide variety of circuits including, for example, a field programmable gate array (FPGA) and a field programmable system-on-a-chip (FPSOC) as will be described below.

Figure 12A:
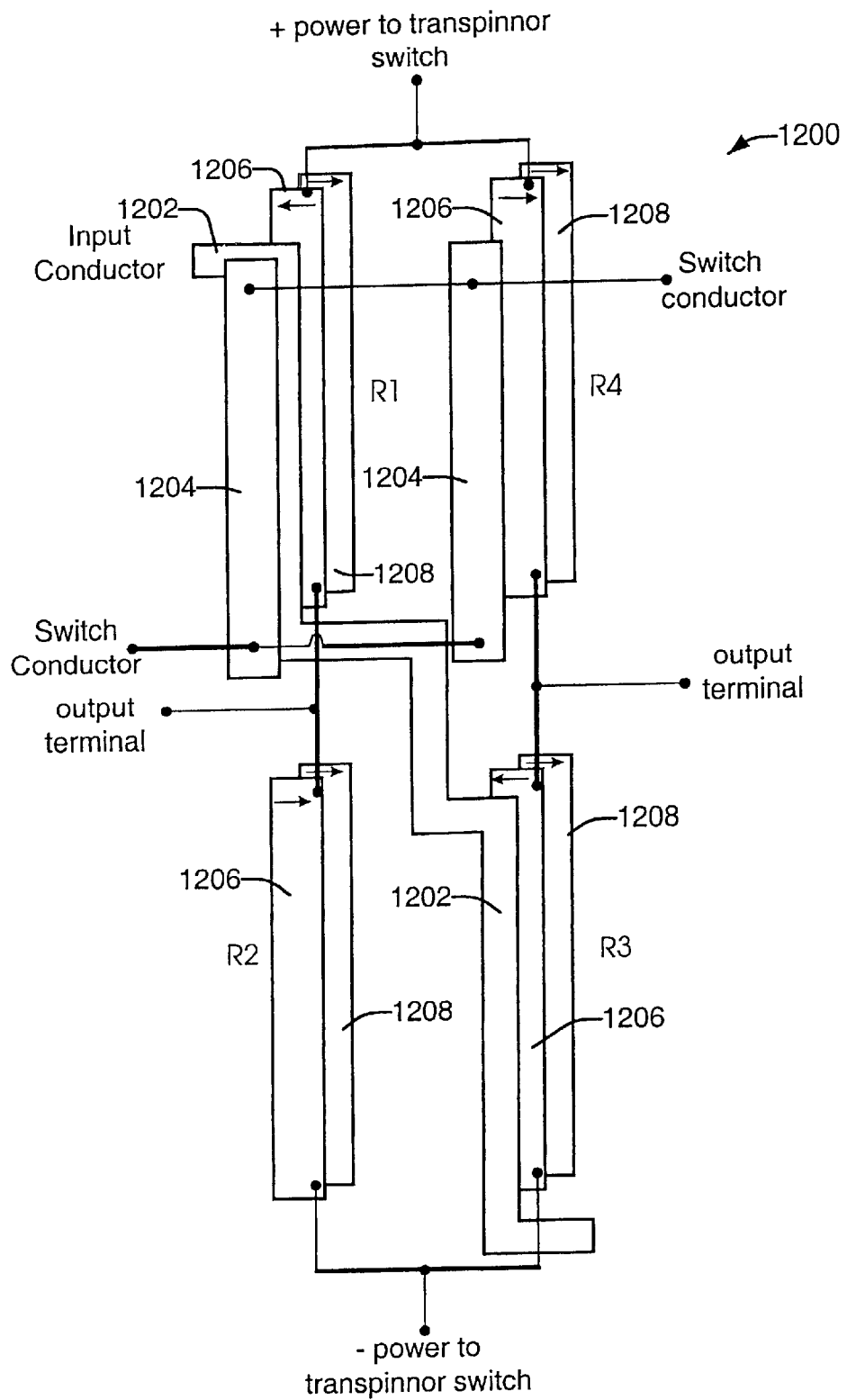
FIGS. 12a and 12b show a transpinnor configured as a switch according to a specific embodiment of the invention.
Figure 12B:
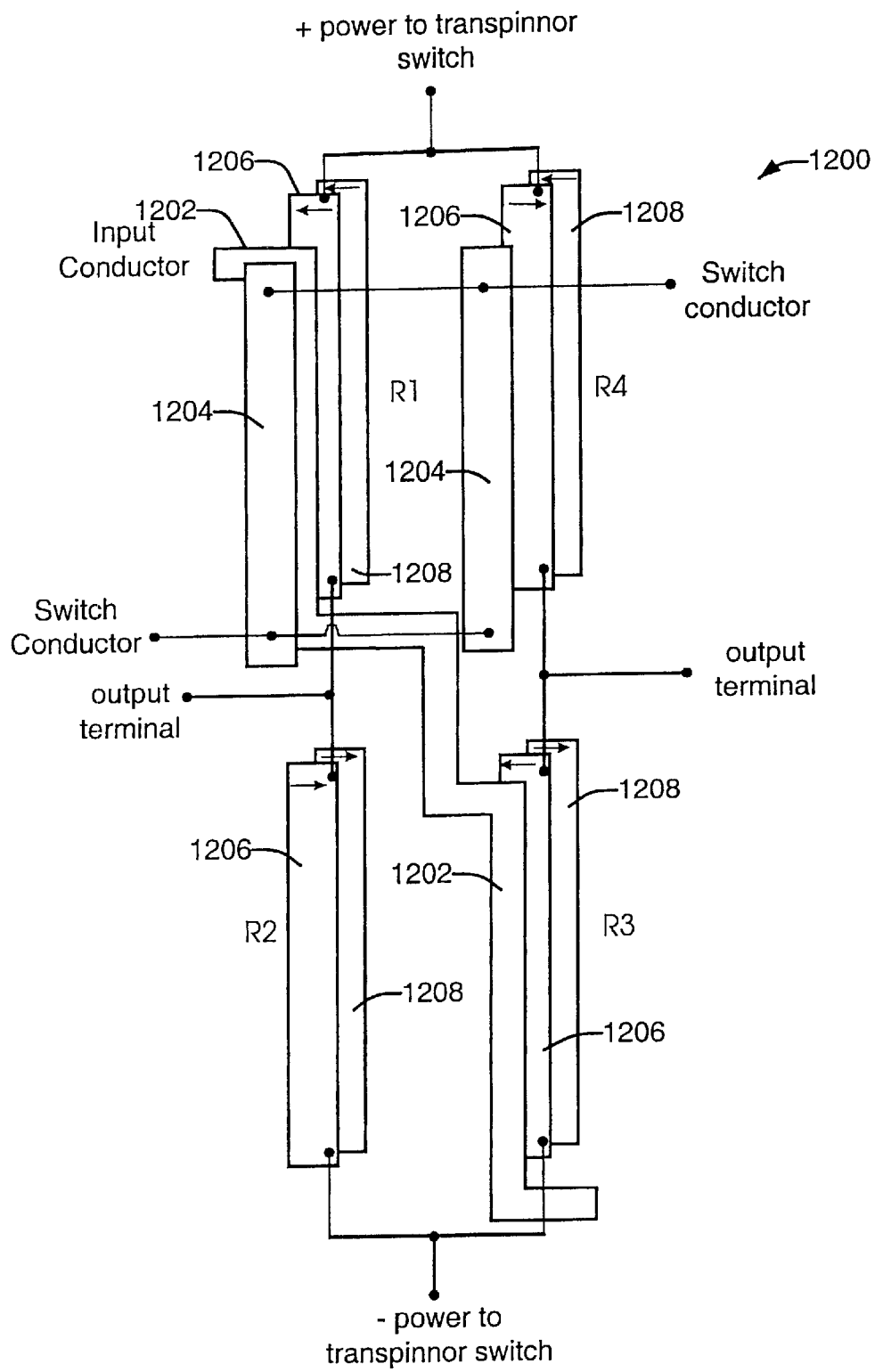

According to various embodiments of the invention, transpinnors may be configured to operate as switches that are nonvolatile like EEPROMs yet are characterized by the programming speed associated with SRAMs. FIGS. 12a and 12b show exploded views of a transpinnor switch 1200 designed according to one such embodiment. The nonmagnetic conductor layer in each GMR film separating the high coercivity layer 1208 (e.g., cobalt) and the low coercivity layer 1206 (e.g., permalloy) is not shown. The basic operation of switch 1200 involves the selective application of a large enough switching current on switch conductor 1204 to set the directions of the magnetization vectors of both the higher and lower-coercivity layers of GMR elements R1 and R4, while the magnitude of the input current on input conductor 1202 is only large enough to switch the lower-coercivity layers of R1 and R3.

As described above and generally speaking, transpinnor technology operates by impressing a specific magnetization direction on a lower-coercivity layer (e.g., permalloy). In digital applications, two opposing magnetizations of this layer correspond to two logic levels. By contrast, the higher-coercivity layer (e.g., cobalt) in such applications remains pinned to a particular magnetization.

As will be discussed, reconfigurability of a programmable SOC may be achieved through a transpinnor switch which includes two nonmagnetic, conductor layers inductively coupled to various ones of the GMR films of which the transpinnor is composed, e.g., FIG. 12. In general and as discussed above, the current in the input conductor of the transpinnor switch is large enough to set (reverse) the magnetization of the lower-coercivity layers of the GMR films to which the input conductor is coupled but not that of the higher-coercivity layers. By contrast, the current in the switch conductor can be large enough to set (reverse) the magnetization of both layers in the GMR films to which the switch conductor is coupled.

The basic idea of the transpinnor switch in digital applications is to use the switch current to control the magnetization of the higher-coercivity layers in selected GMR films of the transpinnor in such a way that the output is either a logic signal following the input, or zero irrespective of the input. It should be noted that there are various ways of configuring the transpinnor switch to realize this functionality. That is, non-magnetic conductors may be inductively coupled to various subsets of the GMR films to achieve this functionality and remain within the scope of the invention.

According to one embodiment shown in FIGS. 12a and 12b, each of the input conductor 1202 and the switch conductor 1204 are inductively coupled to two of the GMR films of the transpinnor 1200. That is, input conductor 1202 is coupled to GMR films R1 and R3, and switch conductor 1204 is coupled to R1 and R4. The nonmagnetic conductor layer between the cobalt and permalloy in each GMR film is not shown for simplicity.

Transpinnor switch 1200 is initialized with all magnetizations in all four films parallel to one another (not shown). In this initialized state the resistances in all four films are low and the transpinnor is balanced, so there is no output when a power voltage is applied. A current is then applied via input conductor 1202 to reverse the magnetization in the low coercivity layers 1206 in films R1 and R3, resulting in a magnetization which is antiparallel to that of high coercivity layers 1208 as shown in FIG. 12a. This increases the resistance of films R1 and R3, unbalances the bridge, and produces a current in the output terminals when power is applied. Thus, in this configuration switch 1200 is "on," i.e., an asserted logic signal on input conductor 1202 produces corresponding logic signal on the output.

To turn switch 1200 "off," a switch current is applied via switch conductor 1204 to set the magnetizations in the high and low coercivity layers of R1 and R4 in a direction opposite the previous magnetization state of the high coercivity layers. Then, a small current is applied via switch conductor 1204 to reverse the low coercivity (but not the high coercivity) magnetizations in R1 and R4. Finally, a current with the same polarity as that used to orient the low coercivity layers in R1 and R3 in FIG. 12a is applied via input conductor 1202. The result is that R1 and R2 are low, R3 and R4 are high, as shown in FIG. 12b, and the transpinnor switch is balanced. Now, when an input current of the same polarity as prior to the reversal of the high coercivity layers is applied, the bridge remains balanced and no output is generated, i.e., the switch is "off," irrespective of the asserted input logic level.

According to various embodiments, several transpinnor switches designed according to the invention may be connected in series to route a single input signal to a variety of circuits within a system. For example, a two-switch device may be configured with one switch "on" and the other "off" such that one of two circuits in a programmable system is enabled while another is disabled. As described above, the low coercivity layers in the "off" switch do not function, i.e., the output current is zero irrespective of which of the two logic levels is asserted at the input, while those in the "on" switch do, i.e., the output signal corresponds to the input signal. However, when the high coercivity layers of the appropriate films in both switches are magnetized in the other direction, the roles of the low coercivity layers in the two switches are reversed. Reconfiguration is thus achieved by simultaneously turning the "on" switch "off" and vice versa.

It should be noted that, according to some embodiments, the transition between balanced and unbalanced transpinnor configurations—and hence between output and no output—can be realized by reversing the polarity of the input signal to set the magnetization of the soft layer alone. However, this would obviate the use of a signal of given polarity to operate the logic circuitry in a given configuration.

According to various embodiment of the invention, there are a variety of ways in which transpinnor switch 1200 may be reconfigured. For example, we have just discussed shutting off the switch by reversing the magnetization of the high coercivity layers in R1 and R4. This shuts off the switch regardless of the input to the low coercivity layers of the films with which the input conductor is associated. It should be understood that one could just as well reverse the high coercivity layers in R2 and R3 to achieve the same effect.

If one instead reverses the high coercivity layers in R1 and R3, this merely reverses the polarity of the output, i.e., the switch conducts with full output for one input polarity. The same is true for switching the high coercivity layers of R2 and R4.

If one reverses the high coercivity layer in only one of the films, the result is a switch with half the output. Reversing the magnetization of the low coercivity layers with an input current does not shut the switch off. Reversing the high coercivity layers in three of the GMR elements (e.g., R1, R2, and R3) also reduces the output by half.

In summary, the two schemes that turn switch 1200 off for both input polarities are either to reverse the magnetization of the high coercivity layers in R1 and R4 or to reverse the magnetization of the high coercivity layers in R2 and R3.

Figure 13A:
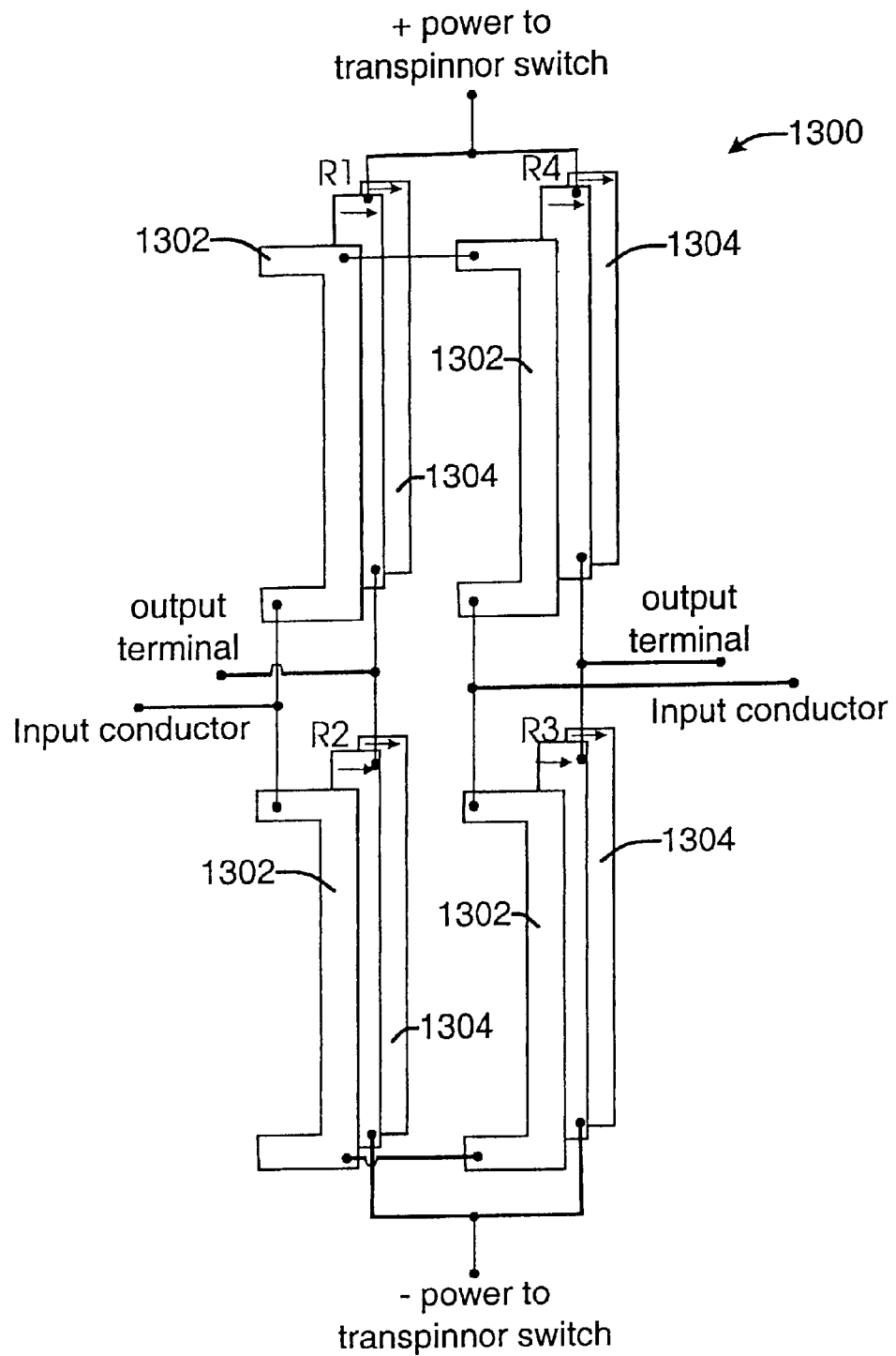
FIGS. 13a and 13b show another transpinnor configured as a switch according to another specific embodiment of the invention.

Transpinnor switch 1200 has an input conductor 1202 coupled to only two thin-film elements, i.e., R1 and R3. Transpinnor switches designed according to various other embodiments of the invention may have an input conductor over all four thin-film elements in the bridge. Such a switch 1300 is shown in FIG. 13a. Input conductor 1302 is coupled to R1–R4 and switch 1300 can be configured to pass input currents of both polarities. Transpinnor switch 1300 can be switched off by reversing the magnetization in high-coercivity layer 1304 of either R1 and R4, or R2 and R3. It should be noted that the switch conductor by which this reversing is accomplished is not shown in FIG. 13a for the sake of simplicity and because of the fact that it can be coupled to either combination of R1 and R4 or R2 and R3.

Figure 13B:
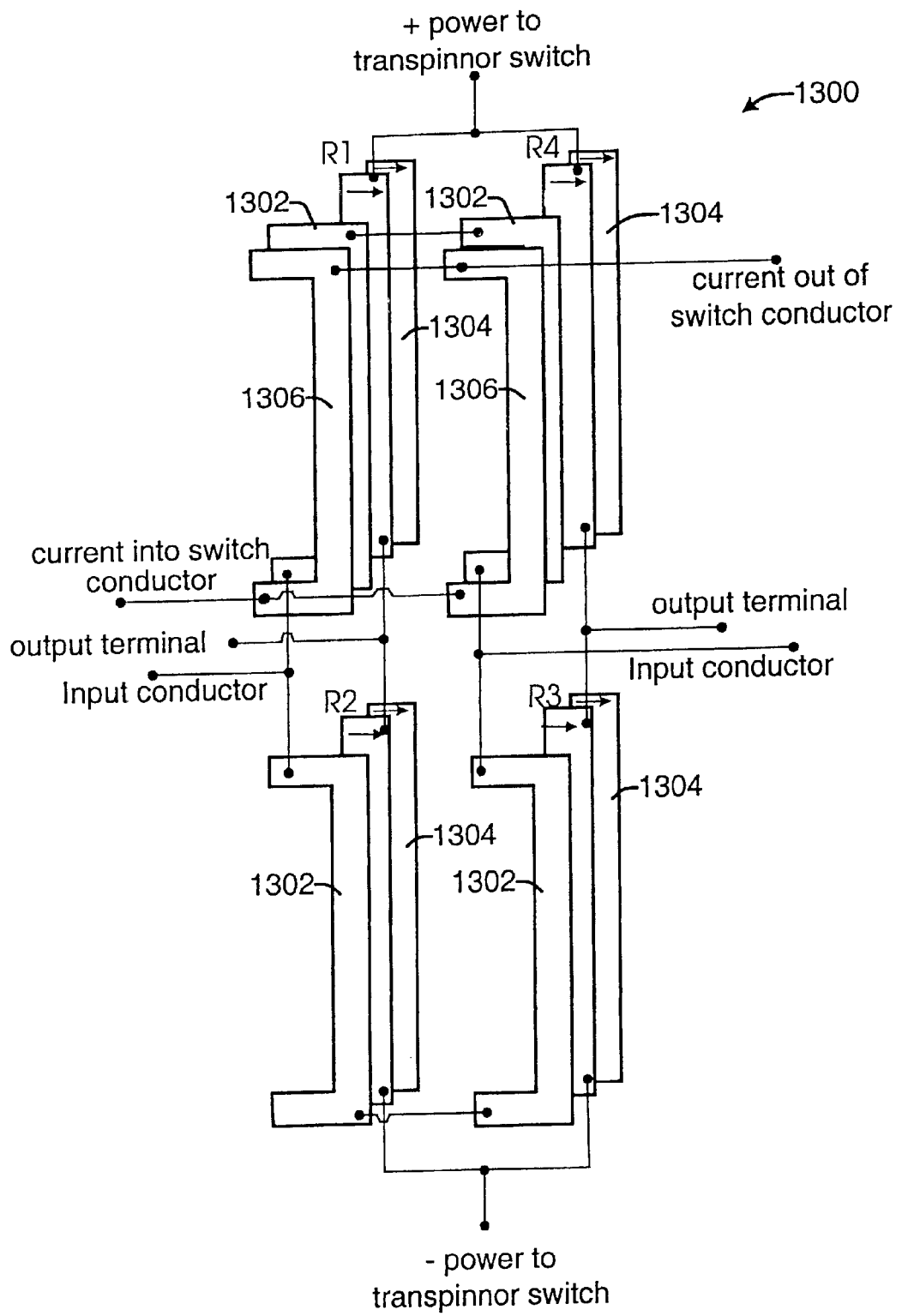

Transpinnor switch 1300 is shown in FIG. 13b with switch conductor 1306 inductively coupled to R1 and R4. This configuration passes both polarities of input current if the high-coercivity layers 1304 of all four thin-film elements are magnetized in the same direction, and blocks all polarities of input current when the magnetization of high-coercivity layers 1304 is reversed in R1 and R4. A similar embodiment (not shown) has the switch conductor associated with R2 and R3.

It should be noted that, according to various embodiments, the transpinnor switch of the present invention may be used for either digital or analog applications. According to an embodiment in which a transpinnor switch is employed to transmit analog signals, the switching field generated by the switching current is perpendicular to the easy-axis of the GMR elements rather than parallel. When the switch is enabled, the switching bias field is raised above the anisotropy field of the lower-coercivity layer. This causes the transpinnor to operate like a linear, nearly lossless transformer. When the bias field is turned off, there is no output unless the signal is large enough to exceed the coercivity of the lower-coercivity layer. In this way, analog signals may also be routed point-to-point according to the invention.

According to various embodiments of the invention, the transpinnor switch of the present invention may be configured to output an amplified version of the input. That is, using the techniques described above, transpinnor switches may be configured to provide a wide range of amplification factors including negative amplification factors, i.e., a transpinnor switch may be configured as an inverter. This amplification capability can be important for applications in which it is desirable to cascade transpinnor switches (see FIG. 14b).

Figure 14:
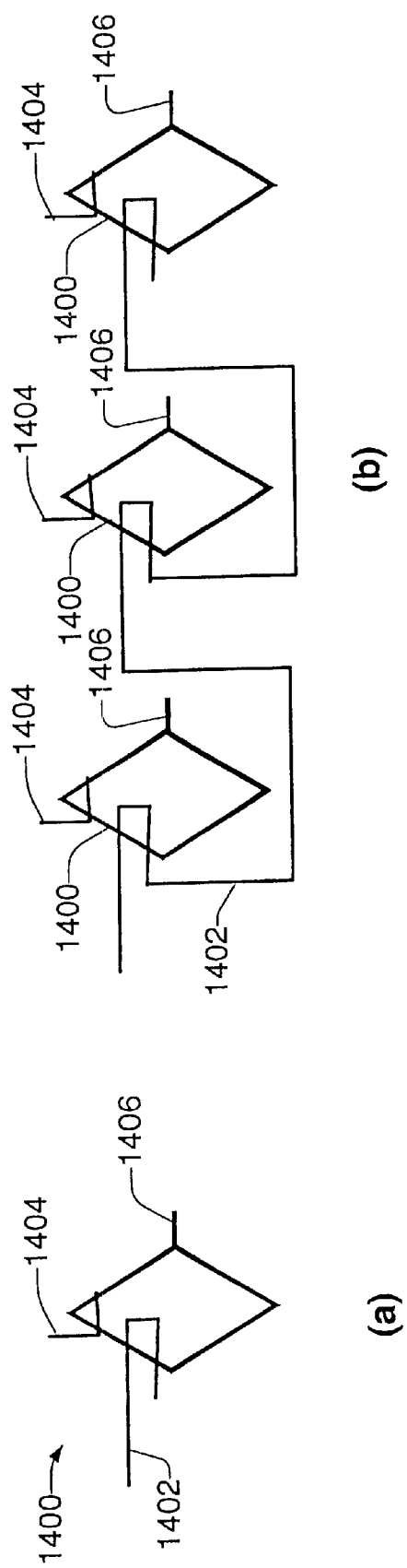
FIGS. 14a and 14b show a circuit symbol of a transpinnor switch and a circuit diagram of three transpinnor switches connected in series.

FIG. 14a shows a circuit symbol representing a transpinnor switch 1400 having an input conductor 1402, a switch conductor 1404, and an output 1406. FIG. 14b shows three such transpinnor switches 1400 sharing the same input conductor 1402 but with three separate outputs 1406, each of which can be turned on or off with the corresponding switch conductor 1404.

Figure 15:
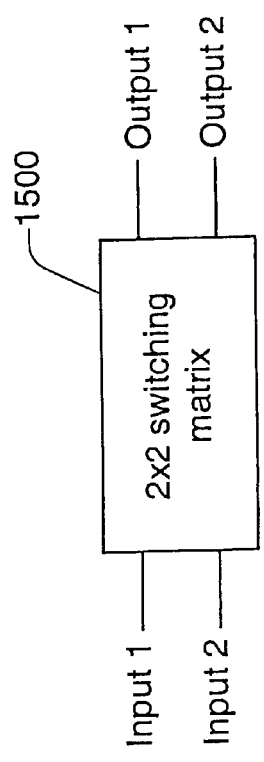
FIG. 15 is a simplified representation of a switching matrix.

The ability to cascade transpinnor switches is also advantageous for creating switching matrices such as the 2×2 switching matrix 1500 shown in FIG. 15. More specific implementations of some exemplary switching matrices will now be described with reference to FIGS. 16a and 16b. It will be understood that the switching matrices shown may be used in a wide variety of context to effect the interconnection of signal paths for any of a variety of purposes. It will also be understood that these basic switching matrices may be expanded beyond the sizes shown to selectively interconnect any of a first plurality of m signal lines with any of a second plurality of n signal lines, i.e., an m×n switching matrix. The relevance of this will become apparent with reference to applications of the transpinnor switch of the present invention described below.

Figure 16:
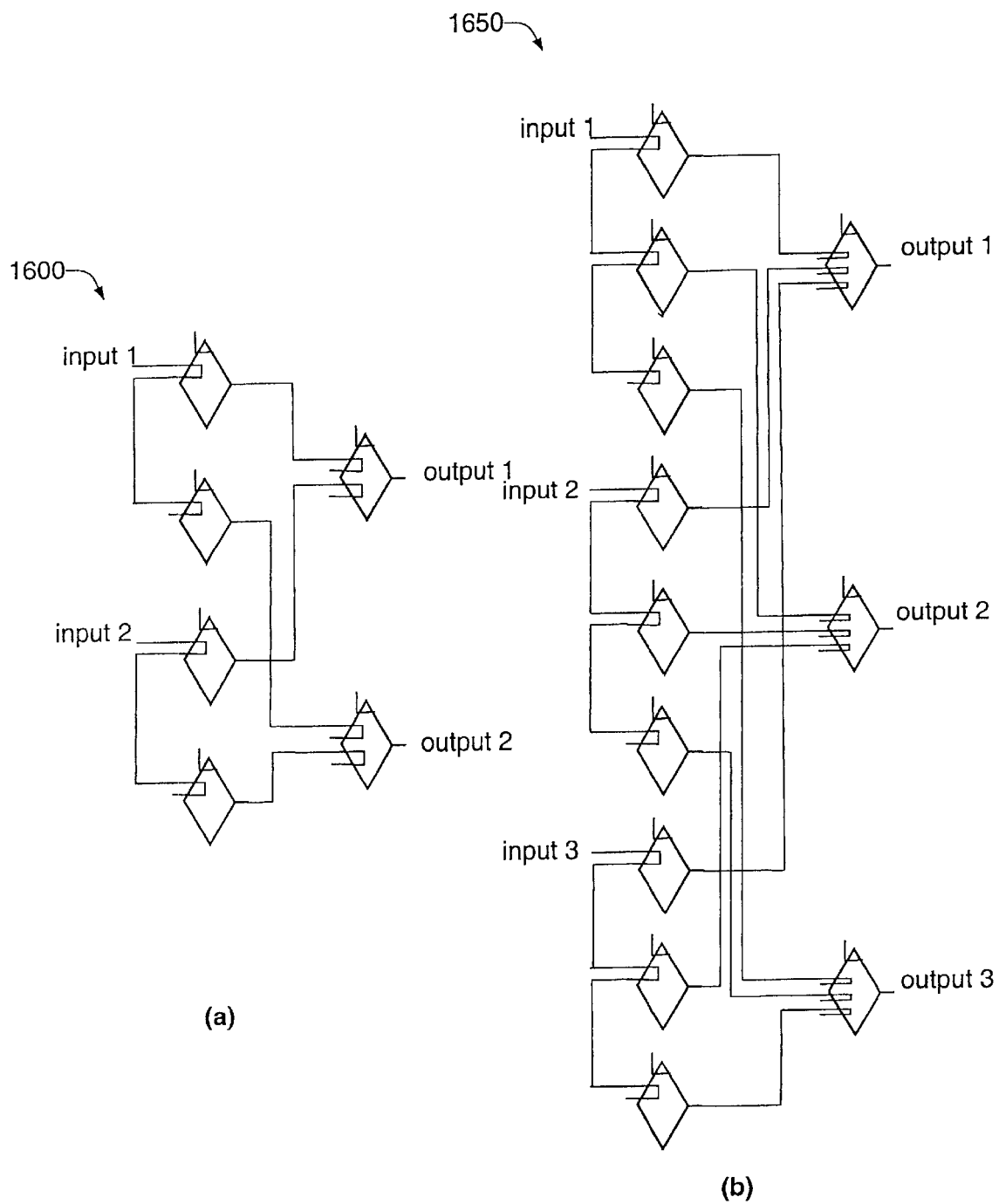
FIGS. 16a and 16b show 2 transpinnor-based switching matrices.

FIG. 16a shows a specific implementation of a 2×2 switching matrix 1600 corresponding to the simplified representation of FIG. 15. Each of the inputs can be switched into any of the outputs. Thus it is possible, for example, to connect input 1 to output 1, and input 2 to output 2, or, input 1 to output 2 and input 2 to output 1. One can have as many inputs to a transpinnor as desired, because an input line may be implemented as a stripline deposited above a GMR film and insulated therefrom, and one can have many such lines, one above another. FIG. 16b shows a specific implementation of a 3×3 switching matrix 1650, in which any input can be connected to any output.

Programmable logic devices (PLDs) are a class of circuits widely used in LSI and VLSI design to implement two-level, sum-of-products Boolean functions. PLDs include programmable array logic (PALs), field programmable gate arrays (FPGAs), programmable logic arrays (PLAs), and read only memories (ROMs). One of the advantages of PLDs is their highly regular layout structure. That is, a typical PLD includes an AND plane followed by an OR plane. The logic function performed by the device is determined by the presence or absence of contacts or connections at row and column intersections in a single conducting layer.

Figure 17:
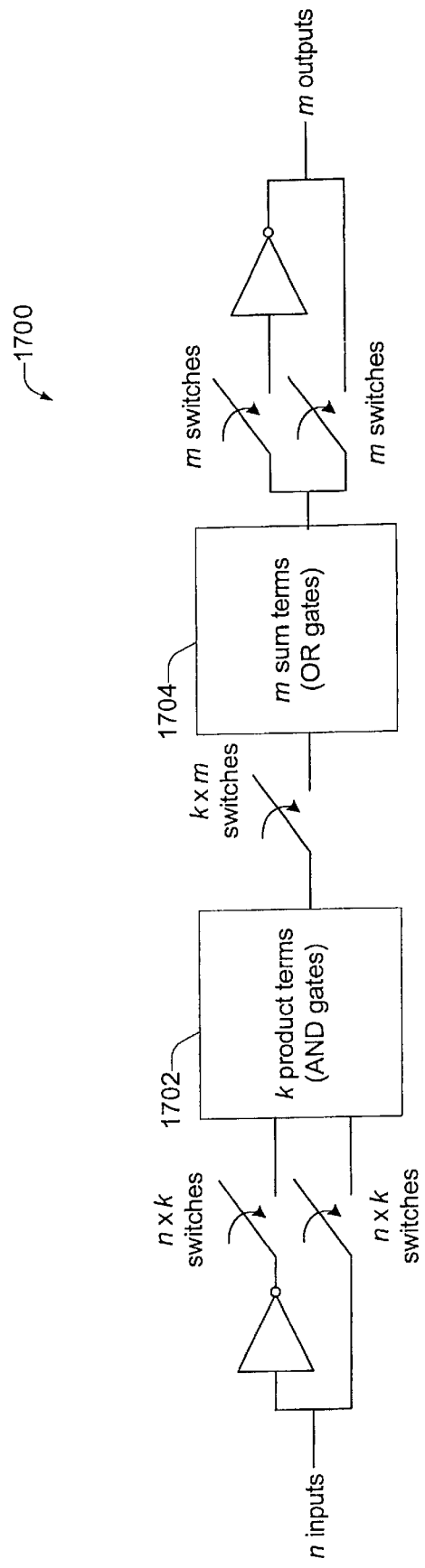
FIG. 17 is a simplified block diagram of a field programmable gate array.

FPGAs are the most flexible of the PLDs in that they can be reconfigured multiple times. In conventional semiconductor technology, FPGA implementations typically choose between two very different types of memories to control their switches, one which ensures nonvolatility, a one which ensures speed. A block diagram of a generic FPGA architecture is shown in FIG. 17. FPGA 1700 has n inputs, k product terms (AND array 1702), m sum terms (OR array 1704), m output, and (2nk+mk+2m) switches. In conventional semiconductor technology, the switches are typically implemented with MOSFETs in conjunction with either EEPROMs or SRAM which may be reloaded with different data to reconfigure the FPGA. A significant drawback with the MOSFET/SRAM combination is that if power is lost, the SRAM must be reloaded for the FPGA to function properly. On the other hand, although EEPROMs avoid this issue because they are nonvolatile, they are an order of magnitude slower than SRAM, limiting the reprogramming speed of an EEPROM-based FPGA accordingly.

Therefore, according to the present invention, an FPGA architecture is provided which employs any of the various embodiments of the transpinnor switches described herein (e.g., transpinnor switch 1200) as the basis for the switch matrices with which the product and sum terms of the FPGA may be interconnected. The nonvolatile nature of the state of these transpinnor switches, and the speed with which they may be accessed and switched results in a solution which has the best of both previous options without the attendant disadvantages. According to some of these embodiments, the product terms and sum terms of the FPGA (e.g., arrays 1702 and 1704) are implemented using transpinnor logic gates including, for example, those described above with reference to FIGS. 8–10.

According to various embodiments, an FPGA architecture designed according to the invention may conform to the conventional paradigm in which switches are controlled by associated memory elements. According to some of these embodiments, the memory elements may be implemented using any of the GMR-based memory cells described in U.S. Pat. No. 5,587,943 for NONVOLATILE MAGNETORESISTIVE MEMORY WITH FULLY CLOSED FLUX OPERATION issued Dec. 24, 1996, and International Publication No. WO 02/05268 A2 entitled ALL METAL GIANT MAGNETORESISTIVE MEMORY published Jan. 17, 2002, the entire disclosures of both of which are incorporated herein by reference for all purposes. Such memory elements will be referred to herein generically as SpinRAM elements.

According to other embodiments, the nonvolatile nature of the transpinnor switch of the present invention obviates the need for controlling the switches with associated memory elements. That is, because the state of the switches designed according to the invention is nonvolatile, the switches themselves may be directly programmed as opposed to indirectly programming them via the associated memory elements.

Figure 18:
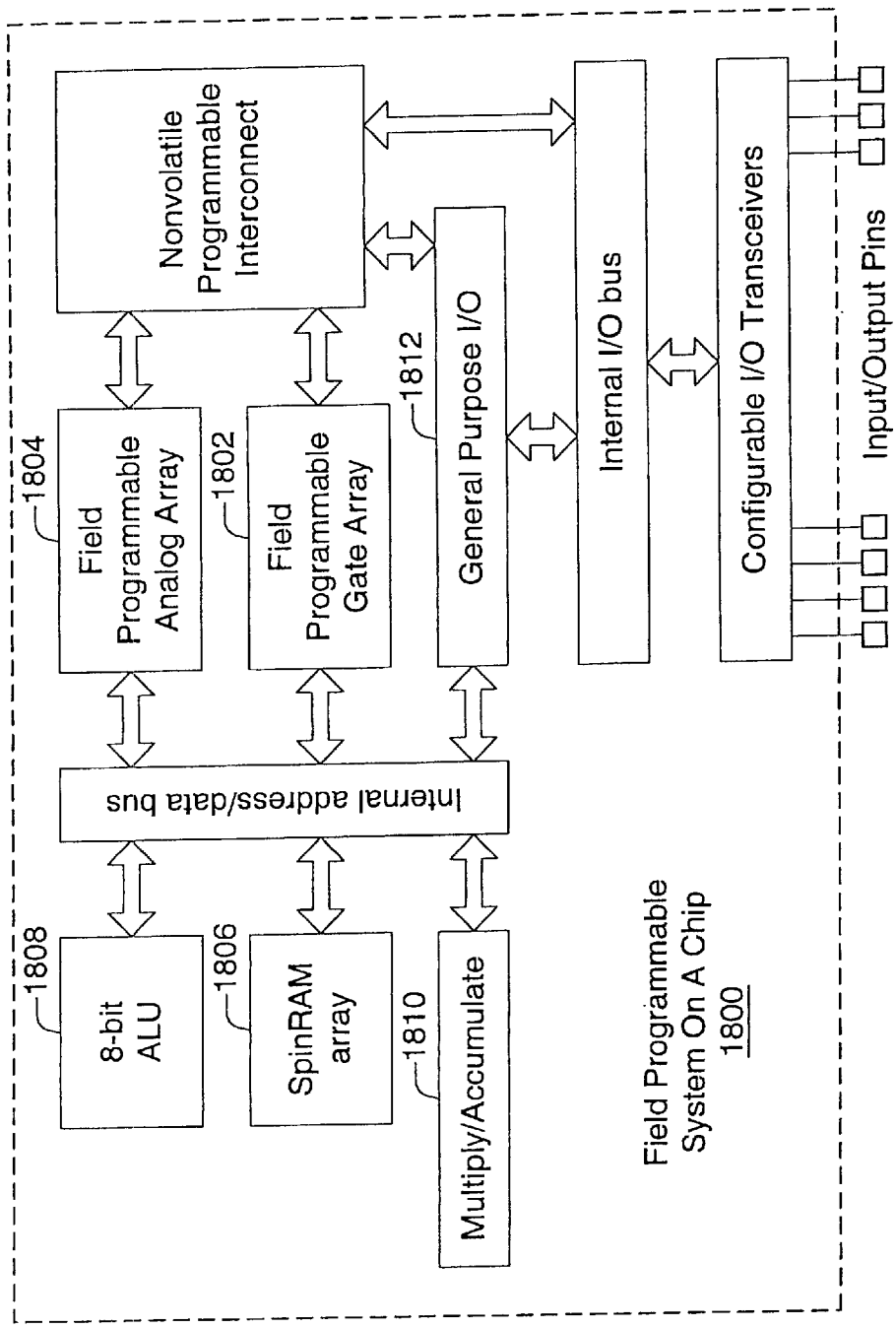
FIG. 18 is a simplified block diagram of a field programmable system on a chip.

According to still other embodiments, one or more FPGAs designed according to the present invention is included as part of a larger, field programmable system-on-a-chip (FPSOC). One such generalized embodiment is shown in FIG. 18. According to various embodiments, any or all of the system components of FPSOC 1800 may be based on all-metal GMR electronics. For example, FPGA 1802 may be implemented as described above using transpinnor switch matrices and transpinnor logic gates. Some or all of the mixed signal components of field programmable analog array 1804 (e.g., differential amplifiers, sample-and-hold circuits, etc.) may be implemented using transpinnor-based circuits. In addition, memory array 1806 may be implemented as a SpinRAM array. Arithmetic logic unit 1808, multiply/accumulate unit 1810, and general purpose I/O 1812 may all be implemented using transpinnor logic gates.

A common method of reconfiguring a FPSOC in conventional semiconductor technology employs logic gates for routing configuration signals. According to one embodiment of the invention, such a method can also be implemented using the transpinnor logic gates described herein. According to other embodiments, advantage is taken of the unique aspects of transpinnor technology to provide a simpler approach using transpinnor switches to reconfigure such FPSOCs.

Generally speaking, PLDs, FPGAs, and FPSOCs designed according to the invention may implement any of the wide variety of functions and be employed in any of the wide variety of applications and environments as any of their conventional counterparts. In addition, for embodiments in which all of the circuit components, functional blocks, and subsystems are based on the all-metal GMR technology described herein, several advantages over conventional semiconductor or hybrid implementations will be enjoyed. That is, such all-metal circuits and systems are intrinsically radiation-hard. From a manufacturing standpoint, fewer processing steps, lower processing temperatures, and fewer masks, make such all-metal implementations logistically and economically superior. Single transpinnor implementations of conventionally more complicated circuits, e.g., logic gates, differential amplifiers, sample-and-hold circuits, comparators, etc., and the closed-flux nature of some memory elements facilitate increased density as well improved more reliable performance.

While the invention has been particularly shown and described with reference to specific embodiments thereof, it will be understood by those skilled in the art that changes in the form and details of the disclosed embodiments may be made without departing from the spirit or scope of the invention. For example, embodiments have been described above with reference to specific types of programmable devices. However, it will be understood that any type of programmable device may employ the transpinnor switch of the present invention. Even more generally, the transpinnor switch of the present invention may be used in any electronic or magnetoelectronic system to perform any type of switching for which the device is suited.

It should also be noted, for example, that the basic transpinnor topology of the present invention is not limited to any particular magnetic materials, bridge configuration, number of thin-film periods, etc. That is, any materials, configurations, periodicity, etc., of thin-film structures which are appropriate to enable the functions described herein are contemplated to be within the scope of the invention.

It is also important to note that the transpinnor switch configurations described herein are merely exemplary and that many functionally equivalent configurations are within the scope of the invention. That is, for example, the input and switch conductors of a transpinnor switch may be coupled to different combinations of transpinnor bridge elements to achieve the effect described, i.e., an output signal representative of the input signal when the GMR films are in a first magnetization state, and substantially no output when the GMR films are in a second magnetization state.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A transpinnor switch comprising a network of thin-film elements in a bridge configuration, selected ones of the thin-film elements exhibiting giant magnetoresistance, the switch also comprising at least one input conductor inductively coupled to a first subset of the selected thin-film elements, and a switch conductor inductively coupled to a second subset of the selected thin-film elements for applying magnetic fields thereto, wherein the switch is configurable using the switch conductor to generate an output signal representative of an input signal on the input conductor, and wherein the switch is also configurable using the switch conductor to generate substantially no output signal regardless of whether the input signal is present.

2. The transpinnor switch of claim 1 wherein each selected thin-film element comprises at least one period of layers, each period comprising a first magnetic layer characterized by a first coercivity and a second magnetic layer characterized by a second coercivity, the first coercivity being greater than the second coercivity.

3. The transpinnor switch of claim 2 wherein the switch conductor is operable to switch both the first and second magnetic layers in the second subset of thin-film elements.

4. The transpinnor switch of claim 2 wherein the input conductor is operable to switch only the second magnetic layer in the first subset of thin-film elements.

5. The transpinnor switch of claim 2 wherein the switch generates the output signal when a switching magnetization of the first magnetic layer is oriented in a first direction, and wherein the switch generates substantially no output signal when the switching magnetization is oriented in a second direction antiparallel to the first direction.

6. The transpinnor switch of claim 5 wherein the first direction is antiparallel to an input signal magnetization corresponding to the input signal, and wherein the second direction is parallel to the input signal magnetization.

7. The transpinnor switch of claim 2 wherein the first magnetic layer comprises cobalt and the second magnetic layer comprises permalloy.

8. The transpinnor switch of claim 2 wherein each selected thin-film element comprises a plurality of periods of the layers.

9. The transpinnor switch of claim 1 wherein the transpinnor switch is configured for analog operation, the input and output signals comprising analog signals, a switching field generated by a switching current in the switch conductor being perpendicular to an easy-axis of the second subset of thin-film elements.

10. The transpinnor switch of claim 1 wherein the transpinnor switch is configured for digital operation, the input and output signals comprising digital signals, a switching field generated by a switching current in the switch conductor being parallel to an easy-axis of the second subset of thin-film elements.

11. The transpinnor switch of claim 1 wherein a magnetization associated with at least one of the thin-film elements is manipulated to resistively balance the bridge configuration.

12. The transpinnor switch of claim 1 wherein the thin-film elements comprise all-metal structures.

13. The transpinnor switch of claim 1 wherein each selected thin-film element forms a closed flux structure.

14. The transpinnor switch of claim 1 wherein each selected thin-film element forms an open flux structure.

15. The transpinnor switch of claim 1 wherein the bridge configuration comprises a Wheatstone bridge.

16. The transpinnor switch of claim 1 wherein all of the thin-film elements in the bridge configuration exhibit giant magnetoresistance.

17. The transpinnor switch of claim 1 wherein only the selected thin-film elements exhibit giant magnetoresistance, any remaining thin-film elements in the bridge configuration comprising resistive elements.

18. The transpinnor switch of claim 1 wherein each of the thin-film elements exhibits giant magnetoresistance, first and second ones of the thin-film elements forming a first path, third and fourth ones of the thin-film elements forming a second path in parallel with the first path, the at least one input conductor being inductively coupled to the first and third thin-film elements, and the switch conductor being inductively coupled to the first and fourth thin-film elements.

19. The transpinnor switch of claim 1 wherein the at least one input conductor comprises a single input conductor.

20. The transpinnor switch of claim 1 wherein the at least one input conductor comprises a plurality of input conductors.

21. The transpinnor switch of claim 1 wherein each of the selected thin-film elements comprises a high coercivity layer and a low coercivity layer, wherein the transpinnor switch is configurable to generate the output signal by using the switch conductor to magnetize the high and low coercivity layers of the second subset of thin-film elements in a first direction, and then using the input conductor to switch the low coercivity layers of the first subset of thin-film elements, and wherein the transpinnor switch is further configurable to generate substantially no output signal by using the switch conductor to magnetize the high and low coercivity layers in a second direction antiparallel to the first direction.

22. A programmable device comprising the transpinnor switch of claim 1.

23. The programmable device of claim 22 further comprising a plurality of logic gates interconnection of which is facilitated in part by the transpinnor switch.

24. The programmable device of claim 23 wherein each of the logic gates comprises a transpinnor.

25. The programmable device of claim 22 wherein the programmable device comprises one of a programmable logic array, a field programmable gate array, a field programmable analog array, programmable array logic, and a read-only memory.

26. The programmable device of claim 22 comprising at least one memory element for controlling the transpinnor switch.

27. The programmable device of claim 26 wherein the at least one memory element comprises a thin-film memory element exhibiting giant magnetoresistance.

28. An electronic system comprising a plurality of system components including the programmable device of claim 22.

29. The electronic system of claim 28 wherein all of the plurality of system components are fabricated on a single substrate with a single set of masks.

30. The transpinnor switch of claim 1 wherein each of the thin-film elements exhibits giant magnetoresistance, first and second ones of the thin-film elements forming a first path, third and fourth ones of the thin-film elements forming a second path in parallel with the first path, the at least one input conductor being inductively coupled to all four of the thin-film elements, and the switch conductor being inductively coupled to the first and fourth thin-film elements.

31. A programmable device comprising:
  a plurality of device components; and
  a plurality of transpinnor switches operable to selectively interconnect the device components, each transpinnor switch comprising a network of thin-film elements in a bridge configuration, selected ones of the thin-film elements exhibiting giant magnetoresistance, the switch also comprising at least one input conductor and a switch conductor inductively coupled to subsets of the selected thin-film elements for applying magnetic fields thereto, wherein the switch is configurable using the switch conductor to generate an output signal representative of an input signal on the input conductor, and wherein the switch is also configurable using the switch conductor to generate substantially no output signal regardless of whether the input signal is present.

32. The programmable device of claim 31 further comprising a plurality of memory elements for controlling the transpinnor switches.

33. The programmable device of claim 32 wherein the memory elements comprise thin-film memory elements exhibiting giant magnetoresistance.

34. The programmable device of claim 31 wherein the plurality of device components comprises a plurality of logic gates.

35. The programmable device of claim 34 wherein each of the logic gates comprises a transpinnor.

36. The programmable device of claim 31 wherein the programmable device comprises one of a programmable logic array, a field programmable gate array, a field programmable analog array, programmable array logic, and a read-only memory.

37. An electronic system comprising a plurality of system components including the programmable device of claim 31.

38. The electronic system of claim 37 wherein all of the plurality of system components are fabricated on a single substrate with a single set of masks.

39. A programmable system in a single integrated circuit, comprising:
  a programmable gate array comprising a plurality of logic gates and a plurality of transpinnor switches operable to selectively interconnect the logic gates, each transpinnor switch comprising a network of thin-film elements in a bridge configuration, selected ones of the thin-film elements exhibiting giant magnetoresistance, the switch also comprising at least one input conductor and a switch conductor inductively coupled to the subsets of the selected thin-film elements for applying magnetic fields thereto, wherein the switch is configurable using the switch conductor to generate an output signal representative of an input signal on the input conductor, and wherein the switch is also configurable using the switch conductor to generate substantially no output signal regardless of whether the input signal is present;
  a memory array comprising a plurality of memory elements each comprising a thin-film structure exhibiting giant magnetoresistance;
  input/output circuitry;
  an arithmetic logic unit;
  a multiply/accumulate unit; and
  an address/data bus interconnecting the programmable gate array, the memory array, the input/output circuitry, the arithmetic logic unit, and the multiply/accumulate unit.

40. The programmable system of claim 39 wherein the input/output circuitry, the arithmetic logic unit, and the multiply/accumulate unit each comprise at least one transpinnor circuit.

41. The programmable system of claim 40 wherein all of the programmable gate array, the memory array, the input/output circuitry, the arithmetic logic unit, the multiply/accumulate unit, and the address/data bus are fabricated on a single substrate with a single set of masks.

42. A transpinnor switch comprising a network of thin-film elements in a bridge configuration, each of the thin-film elements exhibiting giant magnetoresistance, first and second ones of the thin-film elements forming a first path, third and fourth ones of the thin-film elements forming a second path in parallel with the first path, the switch also comprising at least one input conductor inductively coupled to the first and third thin-film elements, and a switch conductor inductively coupled to the first and fourth thin-film elements, wherein the network is configurable using the switch conductor to remain resistively balanced without regard to an input signal on the input conductor, and wherein the network is also configurable using the switch conductor to become resistively unbalanced in response to the input signal.

43. The transpinnor switch of claim 42 wherein each thin-film element comprises at least one period of layers, each period comprising a first magnetic layer characterized by a first coercivity and a second magnetic layer characterized by a second coercivity, the first coercivity being greater than the second coercivity.

44. The transpinnor switch of claim 43 wherein the switch conductor is operable to switch both the first and second magnetic layers in the first and fourth thin-film elements.

45. The transpinnor switch of claim 43 wherein the input conductor is operable to switch only the second magnetic layer in the first and third thin-film elements.

46. The transpinnor switch of claim 43 wherein the network becomes resistively unbalanced when a switching magnetization of the first magnetic layer of the first and fourth thin-film elements is oriented in a first direction, and wherein the network remains resistively balanced when the switching magnetization is oriented in a second direction antiparallel to the first direction.

47. The transpinnor switch of claim 46 wherein the first direction is antiparallel to an input signal magnetization corresponding to the input signal, and wherein the second direction is parallel to the input signal magnetization.

48. The transpinnor switch of claim 43 wherein the first magnetic layer comprises cobalt and the second magnetic layer comprises permalloy.

49. The transpinnor switch of claim 43 wherein each selected thin-film element comprises a plurality of periods of the layers.

50. The transpinnor switch of claim 42 wherein the transpinnor switch is configured for analog operation and operable to generate an output signal representative of the input signal when the network becomes resistively unbalanced, the input and output signals comprising analog signals, a switching field generated by a switching current in the switch conductor being perpendicular to an easy-axis of the first and fourth thin-film elements.

51. The transpinnor switch of claim 42 wherein the transpinnor switch is configured for digital operation and operable to generate an output signal representative of the input signal when the network becomes resistively unbalanced, the input and output signals comprising digital signals, a switching field generated by a switching current in the switch conductor being parallel to an easy-axis of the first and fourth thin-film elements.

52. The transpinnor switch of claim 42 wherein a magnetization associated with at least one of the thin-film elements is manipulated to resistively balance the bridge configuration.

53. The transpinnor switch of claim 42 wherein the thin-film elements comprise all-metal structures.

54. The transpinnor switch of claim 42 wherein each thin-film element forms a closed flux structure.

55. The transpinnor switch of claim 42 wherein each thin-film element forms an open flux structure.

56. The transpinnor switch of claim 42 wherein the bridge configuration comprises a Wheatstone bridge.

57. The transpinnor switch of claim 42 wherein the at least one input conductor comprises a single input conductor.

58. The transpinnor switch of claim 42 wherein the at least one input conductor comprises a plurality of input conductors.

59. A programmable device comprising the transpinnor switch of claim 41.

60. The programmable device of claim 59 further comprising a plurality of logic gates interconnection of which is facilitated in part by the transpinnor switch.

61. The programmable device of claim 60 wherein each of the logic gates comprises a transpinnor.

62. The programmable device of claim 59 wherein the programmable device comprises one of a programmable logic array, a field programmable gate array, a field programmable analog array, programmable array logic, and a read-only memory.

63. The programmable device of claim 59 comprising at least one memory element for controlling the transpinnor switch.

64. The programmable device of claim 63 wherein the at least one memory element comprises a thin-film memory element exhibiting giant magnetoresistance.

65. An electronic system comprising a plurality of system components including the programmable device of claim 59.

66. The electronic system of claim 65 wherein all of the plurality of system components are fabricated on a single substrate with a single set of masks.

67. A programmable device comprising:

a plurality of device components; and a plurality of transpinnor switches operable to selectively interconnect the device components, each transpinnor switch a network of thin-film elements in a bridge configuration, each of the thin-film elements exhibiting giant magnetoresistance, first and second ones of the thin-film elements forming a first path, third and fourth ones of the thin-film elements forming a second path in parallel with the first path, the switch also comprising at least one input conductor inductively coupled to the first and third thin-film elements, and a switch conductor inductively coupled to the first and fourth thin-film elements, wherein the network is configurable using the switch conductor to remain resistively balanced without regard to an input signal on the input conductor, and wherein the network is also configurable using the switch conductor to become resistively unbalanced in response to the input signal.

68. The programmable device of claim 67 further comprising a plurality of memory elements for controlling the transpinnor switches.

69. The programmable device of claim 68 wherein the memory elements comprise thin-film memory elements exhibiting giant magnetoresistance.

70. The programmable device of claim 67 wherein the plurality of device components comprises a plurality of logic gates.

71. The programmable device of claim 70 wherein each of the logic gates comprises a transpinnor.

72. The programmable device of claim 67 wherein the programmable device comprises one of a programmable logic array, a field programmable gate array, a field programmable analog array, programmable array logic, and a read-only memory.

73. An electronic system comprising a plurality of system components including the programmable device of claim 67.

74. The electronic system of claim 73 wherein all of the plurality of system components are fabricated on a single substrate with a single set of masks.

75. A programmable system in a single integrated circuit, comprising:

a programmable gate array comprising a plurality of logic gates and a plurality of transpinnor switches operable to selectively interconnect the logic gates, each transpinnor switch a network of thin-film elements in a bridge configuration, each of the thin-film elements exhibiting giant magnetoresistance, first and second ones of the thin-film elements forming a first path, third and fourth ones of the thin-film elements forming a second path in parallel with the first path, the switch also comprising at least one input conductor inductively coupled to the first and third thin-film elements, and a switch conductor inductively coupled to the first and fourth thin-film elements, wherein the network is configurable using the switch conductor to remain resistively balanced without regard to an input signal on the input conductor, and wherein the network is also configurable using the switch conductor to become resistively unbalanced in response to the input signal;

a memory array comprising a plurality of memory elements each comprising a thin-film structure exhibiting giant magnetoresistance;

input/output circuitry;

an arithmetic logic unit;

a multiply/accumulate unit; and an address/data bus interconnecting the programmable gate array, the memory array, the input/output circuitry, the arithmetic logic unit, and the multiply/accumulate unit.

76. The programmable system of claim 75 wherein the input/output circuitry, the arithmetic logic unit, and the multiply/accumulate unit each comprise at least one transpinnor circuit.

77. The programmable system of claim 76 wherein all of the programmable gate array, the memory array, the input/output circuitry, the arithmetic logic unit, the multiply/accumulate unit, and the address/data bus are fabricated on a single substrate with a single set of masks.

* * * * *